US012701861B2

(12) United States Patent
Yamazaki et al.

(10) Patent No.: US 12,701,861 B2
(45) Date of Patent: Aug. 4, 2026

(54) DISPLAY DEVICE INCLUDING A STRUCTURE IN WHICH THREE LAYERS HAVING ELECTRICAL CIRCUITS ARE STACKED

(71) Applicant: SEMICONDUCTOR ENERGY LABORATORY CO., LTD., Atsugi (JP)

(72) Inventors: Shunpei Yamazaki, Tokyo (JP); Takayuki Ikeda, Atsugi (JP); Tatsuya Onuki, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 415 days.

(21) Appl. No.: 18/260,976

(22) PCT Filed: Jan. 6, 2022

(86) PCT No.: PCT/IB2022/050076
§ 371 (c)(1),
(2) Date: Jul. 11, 2023

(87) PCT Pub. No.: WO2022/153146
PCT Pub. Date: Jul. 21, 2022

(65) Prior Publication Data
US 2024/0057382 A1 Feb. 15, 2024

(30) Foreign Application Priority Data

Jan. 14, 2021 (JP) ................................. 2021-004390

(51) Int. Cl.
*H10K 59/12* (2023.01)
*H10K 59/121* (2023.01)
*H10K 59/80* (2023.01)

(52) U.S. Cl.
CPC ....... *H10K 59/1213* (2023.02); *H10K 59/873* (2023.02); *H10K 59/879* (2023.02)

(58) Field of Classification Search
CPC . H10K 59/1213; H10K 59/879; H10K 59/873
(Continued)

(56) References Cited

U.S. PATENT DOCUMENTS

| | | | |
|---|---|---|---|
| 5,953,985 A | 9/1999 | Kobayashi | |
| 6,120,338 A | 9/2000 | Hirano et al. | |

(Continued)

FOREIGN PATENT DOCUMENTS

| | | |
|---|---|---|
| CN | 102737578 A | 10/2012 |
| CN | 107819009 A | 3/2018 |

(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

(Continued)

*Primary Examiner* — Phuc T Dang
(74) *Attorney, Agent, or Firm* — Fish & Richardson P.C.

(57) ABSTRACT

A novel display device is provided. The display device includes a first layer, a second layer, and a third layer. The first layer, the second layer, and the third layer are provided in different layers. The first layer includes a driver circuit and a functional circuit. The second layer includes a pixel circuit. The third layer includes a display element. The pixel circuit has a function of controlling light emission of the display element. The driver circuit has a function of controlling the pixel circuit. The functional circuit has a function of controlling the driver circuit. The first layer includes a first transistor with a semiconductor layer containing silicon in a channel formation region. The second layer (Continued)

includes a second transistor with a semiconductor layer containing a metal oxide in a channel formation region.

5 Claims, 19 Drawing Sheets

(58) Field of Classification Search
    USPC ......................................................... 257/72
    See application file for complete search history.

(56) References Cited

U.S. PATENT DOCUMENTS

| | | | |
|---|---|---|---|
| 7,457,024 | B2 | 11/2008 | Takeuchi et al. |
| 8,780,023 | B2 | 7/2014 | Ootorii |
| 9,236,408 | B2 | 1/2016 | Yamazaki |
| 10,373,983 | B2 | 8/2019 | Takahashi et al. |
| 10,490,553 | B2 | 11/2019 | Yamazaki |
| 10,586,495 | B2 | 3/2020 | Kobayashi et al. |
| 11,205,387 | B2 | 12/2021 | Kobayashi et al. |
| 11,423,844 | B2 | 8/2022 | Ikeda et al. |
| 12,159,573 | B2 | 12/2024 | Yamazaki et al. |
| 12,243,482 | B2 | 3/2025 | Yamazaki et al. |
| 2002/0072139 | A1 | 6/2002 | Kashiwabara |
| 2006/0290595 | A1 | 12/2006 | Takeuchi et al. |
| 2011/0089417 | A1 | 4/2011 | Yamazaki et al. |
| 2011/0148290 | A1 | 6/2011 | Oota |
| 2012/0256204 | A1 | 10/2012 | Yoshizumi et al. |
| 2012/0256814 | A1 | 10/2012 | Ootorii |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto et al. |
| 2015/0069360 | A1 | 3/2015 | Sato |
| 2015/0076476 | A1 | 3/2015 | Odaka et al. |
| 2016/0172595 | A1 | 6/2016 | Malinowski et al. |
| 2016/0315133 | A1 | 10/2016 | Sato |
| 2017/0141167 | A1 | 5/2017 | Naganuma |
| 2017/0256754 | A1 | 9/2017 | Defranco et al. |
| 2018/0026218 | A1 | 1/2018 | Kobayashi et al. |
| 2018/0074361 | A1 | 3/2018 | Chung et al. |
| 2018/0190908 | A1 | 7/2018 | Ke et al. |
| 2020/0203662 | A1 | 6/2020 | Mollard et al. |
| 2021/0383762 | A1 | 12/2021 | Kobayashi et al. |
| 2023/0022181 | A1 | 1/2023 | Ikeda et al. |
| 2024/0029636 | A1 | 1/2024 | Yamazaki et al. |
| 2025/0087145 | A1 | 3/2025 | Yamazaki et al. |

FOREIGN PATENT DOCUMENTS

| | | | | |
|---|---|---|---|---|
| CN | 210926018 | U | 7/2020 | |
| CN | 112119446 | A | 12/2020 | |
| JP | 2000-036385 | A | 2/2000 | |
| JP | 2003-059663 | A | 2/2003 | |
| JP | 2003-140571 | A | 5/2003 | |
| JP | 2007-003699 | A | 1/2007 | |
| JP | 2008-098106 | A | 4/2008 | |
| JP | 2008-147072 | A | 6/2008 | |
| JP | 2008-251270 | A | 10/2008 | |
| JP | 2012-227514 | A | 11/2012 | |
| JP | 2014-120218 | A | 6/2014 | |
| JP | 2014-135251 | A | 7/2014 | |
| JP | 2014-232568 | A | 12/2014 | |
| JP | 2015-115178 | A | 6/2015 | |
| JP | 2016-197494 | A | 11/2016 | |
| JP | 2017054124 | A | * 3/2017 | ....... G02F 1/133555 |
| JP | 2018-022143 | A | 2/2018 | |
| JP | 2019078847 | A | * 5/2019 | ............ H10K 71/40 |
| JP | 2019-179696 | A | 10/2019 | |
| JP | 2020-160305 | A | 10/2020 | |
| JP | 2020-187186 | A | 11/2020 | |
| KR | 2018-0030325 | A | 3/2018 | |
| KR | 2021-0007989 | A | 1/2021 | |
| TW | 201303832 | | 1/2013 | |
| WO | WO-2019/220278 | | 11/2019 | |
| WO | WO-2022/118141 | | 6/2022 | |
| WO | WO-2022/118151 | | 6/2022 | |
| WO | WO-2022/123387 | | 6/2022 | |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos. N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

International Search Report (Application No. PCT/IB2022/050076) Dated Apr. 19, 2022.

Written Opinion (Application No. PCT/IB2022/050076) Dated Apr. 19, 2022.

* cited by examiner

| | |
|---|---|
| Start | S1 |
| Pixel current reading | S2 |
| Voltage conversion | S3 |
| Pixel parameter acquisition | S4 |
| Abnormality determination | S5 |
| Correction processing | S6 |
| End | S7 |

52I

FIG. 12A
FIG. 12C
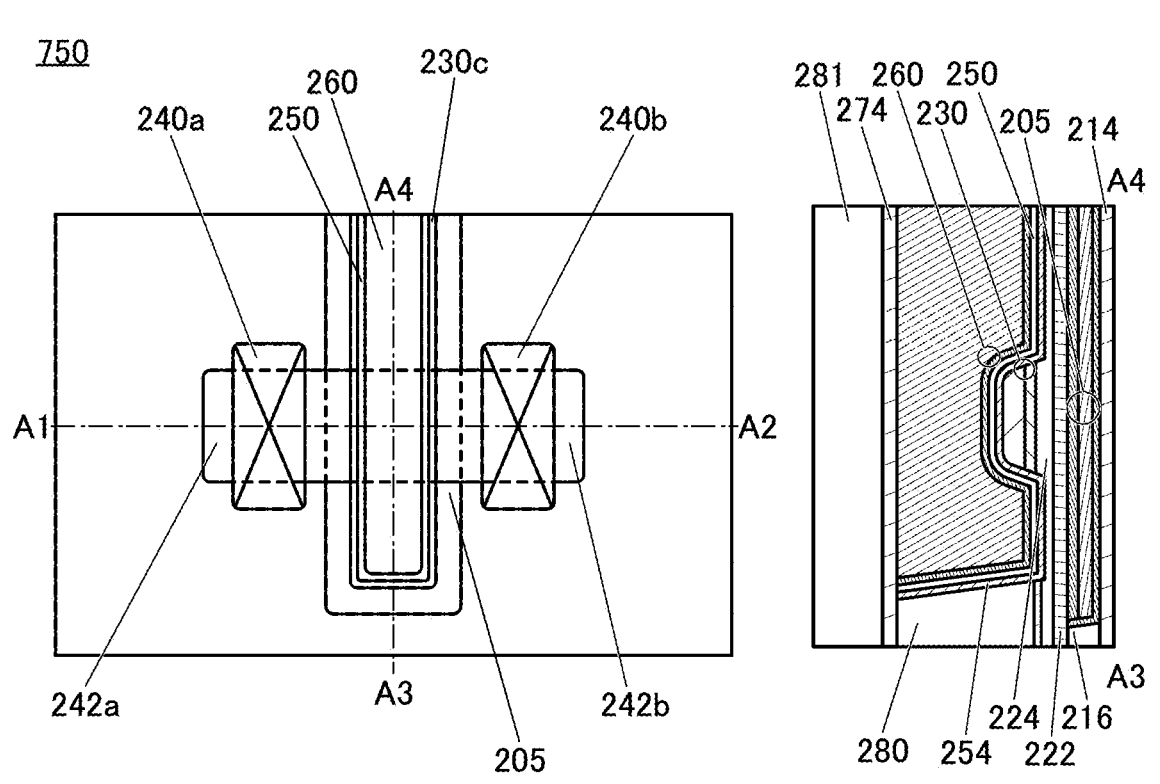
FIG. 12B
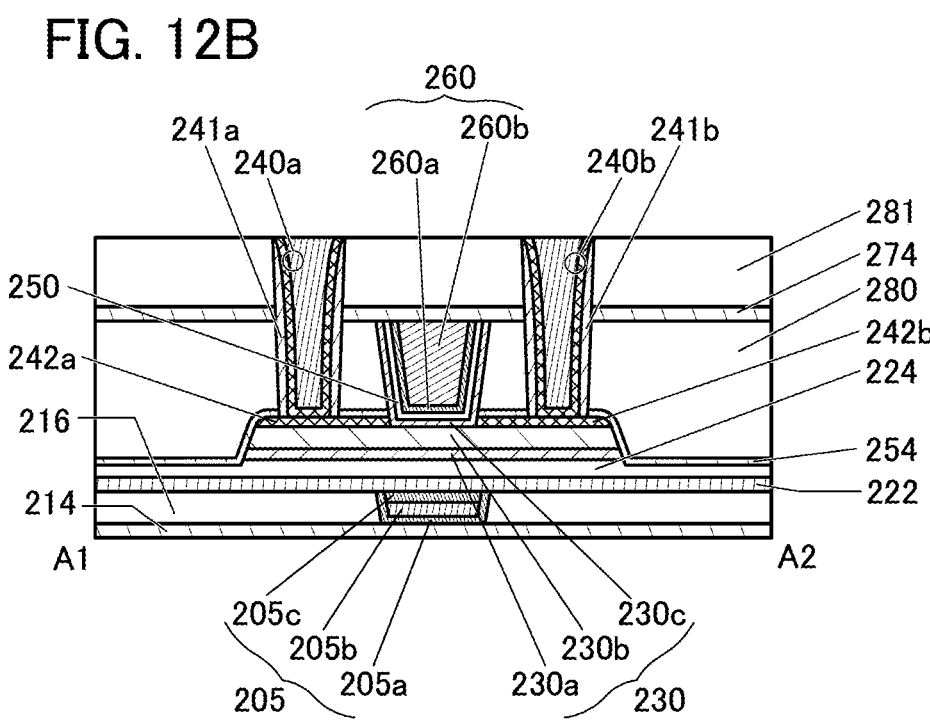

FIG. 13A
Intermediate siate
New crystalline phase
| Amorphous | Crystalline | Crystal |
|---|---|---|
| ·completely amorphous | ·CAAC<br>·nc<br>·CAC<br><br>excluding single crystal and poly crystal | ·single crystal<br>·poly crystal |
FIG. 13B
FIG. 13C
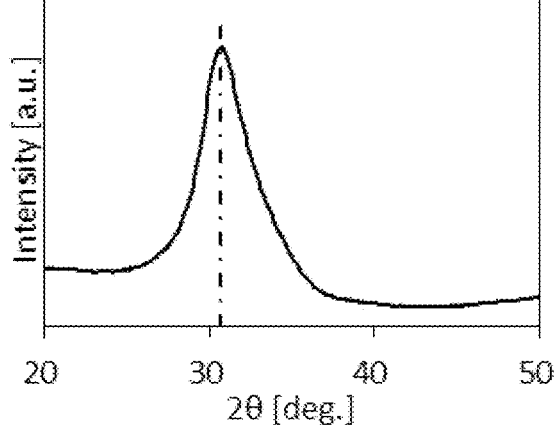
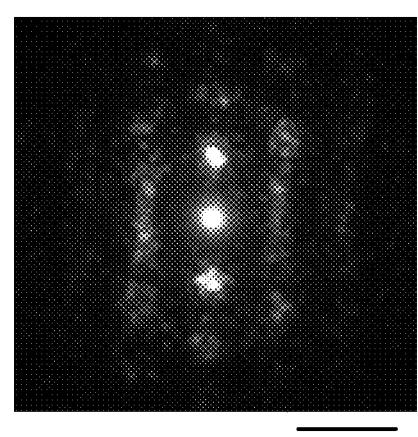
5nm⁻¹

FIG. 18A
8200
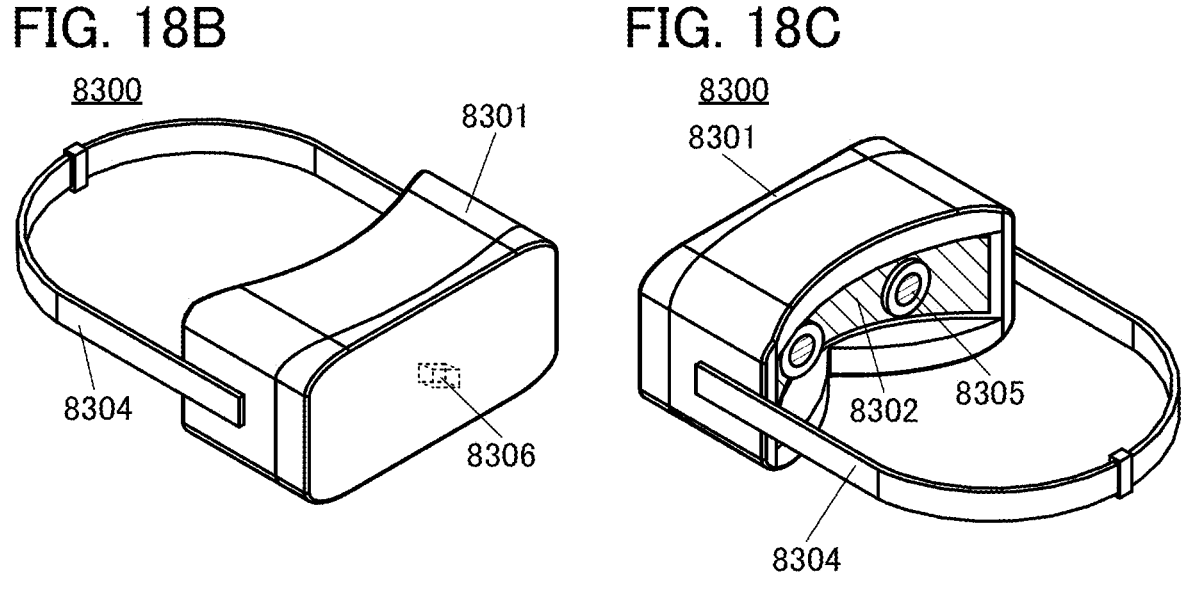
FIG. 18B
8300
FIG. 18C
8300
FIG. 18D
8300
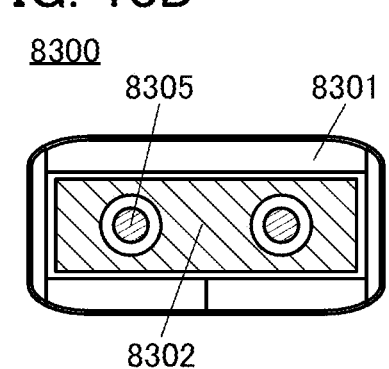

9101

9200

DISPLAY DEVICE INCLUDING A STRUCTURE IN WHICH THREE LAYERS HAVING ELECTRICAL CIRCUITS ARE STACKED

CROSS REFERENCE TO RELATED APPLICATIONS

This application is a U.S. National Phase Application under 35 U.S.C. § 371 of International Application PCT/IB2022/050076, filed on Jan. 6, 2022, which is incorporated by reference and claims the benefit of a foreign priority application filed in Japan on Jan. 14, 2021, as Application No. 2021-004390.

TECHNICAL FIELD

One embodiment of the present invention relates to a display device. One embodiment of the present invention relates to a method for manufacturing a display device.

Note that one embodiment of the present invention is not limited to the above technical field. Examples of the technical field of one embodiment of the present invention disclosed in this specification and the like include a semiconductor device, a display device, a light-emitting apparatus, a power storage device, a storage device, an electronic device, a lighting device, an input device, an input/output device, a driving method thereof, and a fabrication method thereof.

BACKGROUND ART

In recent years, higher resolution of display devices has been desired. For example, devices for virtual reality (VR), augmented reality (AR), substitutional reality (SR), or mixed reality (MR) are given as devices requiring high-resolution display devices and have been actively developed in recent years. Display devices used for these devices are required to be downsized as well as to increase resolution.

Typical examples of a display device include a liquid crystal display device; a light-emitting device including a light-emitting element such as an organic electroluminescence (EL) element or a light emitting diode (LED); and electronic paper performing display by an electrophoretic method or the like.

The basic structure of an organic EL element is, for example, a structure in which a layer containing a light-emitting organic compound is provided between a pair of electrodes. By applying voltage to this element, light emission can be obtained from the light-emitting organic compound. A display device using such an organic EL element does not need a backlight that is necessary for a liquid crystal display device and the like; thus, a thin, lightweight, high-contrast, and low-power display device can be achieved. Patent Document 1, for example, discloses an example of a display device using an organic EL element. In the case where a high display quality is required as in the display device in Patent Document 1, a high-resolution display device including a large number of pixels is required in some cases.

REFERENCE

Patent Document

[Patent Document 1] PCT International Publication No. 2019/220278

SUMMARY OF THE INVENTION

Problems to be Solved by the Invention

A display device having high display quality, such as the one disclosed in Patent Document 1, is desired for VR and AR devices. In this case, an image is displayed in a wearable housing, like in a glasses-type device or a goggle-type device; therefore, small size and light weight are important factors for the display device. In the wearable housing, for example, the size of the display device needs to be reduced to approximately 2 inches or smaller, or 1 inch or smaller.

A display device requires a driver circuit such as a gate driver or a source driver for driving pixels, or a functional circuit such as an application processor for generating a control signal or the like for performing display. In the case where the display device includes a driver circuit and a functional circuit separately, in addition to a pixel circuit with a plurality of pixels, the length of wirings for electrically connecting the circuits increases, which would make a reduction in size and weight of the display device difficult. Furthermore, in the case where the display device includes a driver circuit and a functional circuit that are monolithically provided, in addition to a pixel circuit with a plurality of pixels, the addition of the driver circuit and the functional circuit to the pixel circuit increases the circuit area, which would make a reduction in size and weight of the display device difficult.

An object of one embodiment of the present invention is to provide a display device with a reduced size. Another object of one embodiment of the present invention is to provide a display device with a reduced weight. Another object of one embodiment of the present invention is to provide a display device having superior display quality. Another object of one embodiment of the present invention is to provide a novel display device.

Note that the description of these objects does not preclude the existence of other objects. One embodiment of the present invention does not need to achieve all these objects. Note that objects other than these can be derived from the description of the specification, the drawings, the claims, and the like.

Means for Solving the Problems

One embodiment of the present invention is a display device including a first layer, a second layer, and a third layer, in which the first layer, the second layer, and the third layer are provided in different layers, the first layer includes a driver circuit and a functional circuit, the second layer includes a pixel circuit, the third layer includes a display element, the pixel circuit has a function of controlling light emission of the display element, the driver circuit has a function of controlling the pixel circuit, and the functional circuit has a function of controlling the driver circuit.

One embodiment of the present invention is a display device including a first layer, a second layer, and a third layer, in which the first layer, the second layer, and the third layer are provided in different layers, the first layer includes a driver circuit and a functional circuit, the second layer includes a pixel circuit, the third layer includes a display element, the first layer includes a first transistor with a semiconductor layer containing silicon in a channel formation region, the second layer includes a second transistor with a semiconductor layer containing a metal oxide in a channel formation region, the pixel circuit has a function of controlling light emission of the display element, the driver circuit has a function of controlling the pixel circuit, and the functional circuit has a function of controlling the driver circuit.

In one embodiment of the present invention, the display device with the metal oxide including In, an element M (M is Al, Ga, Y, or Sn), and Zn is preferable.

In one embodiment of the present invention, the display device with the display element including an organic EL element, the organic EL element being a display element processed by a photolithography method, is preferable.

In one embodiment of the present invention, the display device with the driver circuit including a gate driver circuit and a source driver circuit is preferable.

In one embodiment of the present invention, the display device with the pixel circuit being divided into a plurality of regions and provided, one of the plurality of regions including the source driver circuit and the gate driver circuit, a plurality of source lines being electrically connected to the source driver circuit, and a plurality of gate lines being electrically connected to the gate driver circuit, is preferable.

One embodiment of the present invention is an electronic device including the above display device, a fixing member, a pair of lenses, and a battery.

Note that other embodiments of the present invention are shown in the description of the following embodiments and the drawings.

Effect of the Invention

One embodiment of the present invention can provide a display device with reduced size. Another embodiment of the present invention can provide a display device with reduced weight. Another embodiment of the present invention can provide a display device having superior display quality. Another embodiment of the present invention can provide a novel display device.

Note that the description of these effects does not preclude the existence of other effects. One embodiment of the present invention does not need to have all the effects. Note that other effects can be derived from the description of the specification, the drawings, the claims, and the like.

BRIEF DESCRIPTION OF THE DRAWINGS

FIG. 12A to FIG. 12C are diagrams illustrating a structure example of a display device.

FIG. 13A is a diagram showing classification of crystal structures. FIG. 13B is a graph showing an XRD spectrum of a CAAC-IGZO film. FIG. 13C is an image showing nanobeam electron diffraction patterns of a CAAC-IGZO film.

FIG. 18A to FIG. 18D are diagrams each illustrating a structure example of an electronic device.

MODE FOR CARRYING OUT THE INVENTION

Figure 1A:
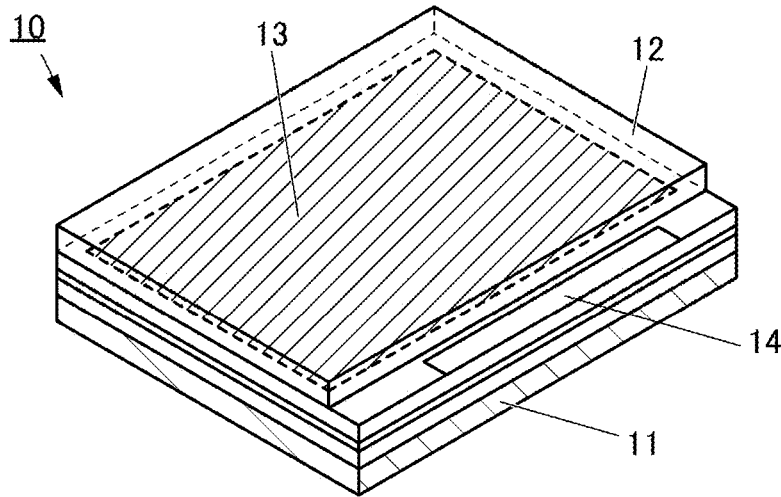
FIG. 1A and FIG. 1B are diagrams illustrating a structure example of a display device.

Hereinafter, embodiments will be described with reference to the drawings. However, the embodiments can be implemented with various modes, and it will be readily appreciated by those skilled in the art that modes and details can be changed in various ways without departing from the spirit and scope of the present invention. Thus, the present invention should not be construed as being limited to the following description of the embodiments.

In the drawings, the size, the layer thickness, or the region is exaggerated for clarity in some cases. Thus, they are not limited to the illustrated scale. Note that the drawings schematically illustrate ideal examples, and embodiments of the present invention are not limited to shapes, values, and the like illustrated in the drawings.

Furthermore, unless otherwise specified, an off-state current in this specification and the like refers to a drain current of a transistor in an off state (also referred to as a non-conduction state or a cutoff state). Unless otherwise specified, an off state refers to, in an n-channel transistor, a state where voltage $V_{gs}$ between its gate and source is lower than the threshold voltage $V_{th}$ (in a p-channel transistor, higher than $V_{th}$).

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, an OS transistor can also be called a transistor including a metal oxide or an oxide semiconductor.

In this specification and the like, a device formed using a metal mask or an FMM (fine metal mask, high-resolution metal mask) may be referred to as a device having an MM (metal mask) structure. In this specification and the like, a device formed without using a metal mask or an FMM is sometimes referred to as a device having an MML (metal maskless) structure.

Embodiment 1

A structure example of a display device of one embodiment of the present invention will be described below with reference to drawings.

FIG. 1A is a schematic perspective view of a display device 10.

The display device 10 includes a substrate 11 and a substrate 12. The display device includes a display portion 13 composed of elements provided between the substrate 11 and the substrate 12. The display portion 13 is a region where an image is displayed on the display device 10. The display portion 13 corresponds to a region where pixel circuits and pixels including display elements connected to the pixel circuits are provided.

In this specification and the like, the term "element" can be replaced with the term "device" in some cases. For example, a display element, a light-emitting element, and a liquid crystal element can be replaced with a display device, a light-emitting device, and a liquid crystal device, respectively.

In the display device 10, various kinds of signals and power supply potentials are input from the outside via a terminal portion 14, whereby an image can be displayed on the display portion 13. A plurality of layers are provided between the substrate 11 and the substrate 12, and each of the layers is provided with a transistor for circuit operation, or a display element which emits light. A pixel circuit having a function of controlling light emission of the display element, a driver circuit having a function of controlling the pixel circuit, a functional circuit having a function of controlling the driver circuit, and the like are provided in the plurality of layers.

Figure 1B:
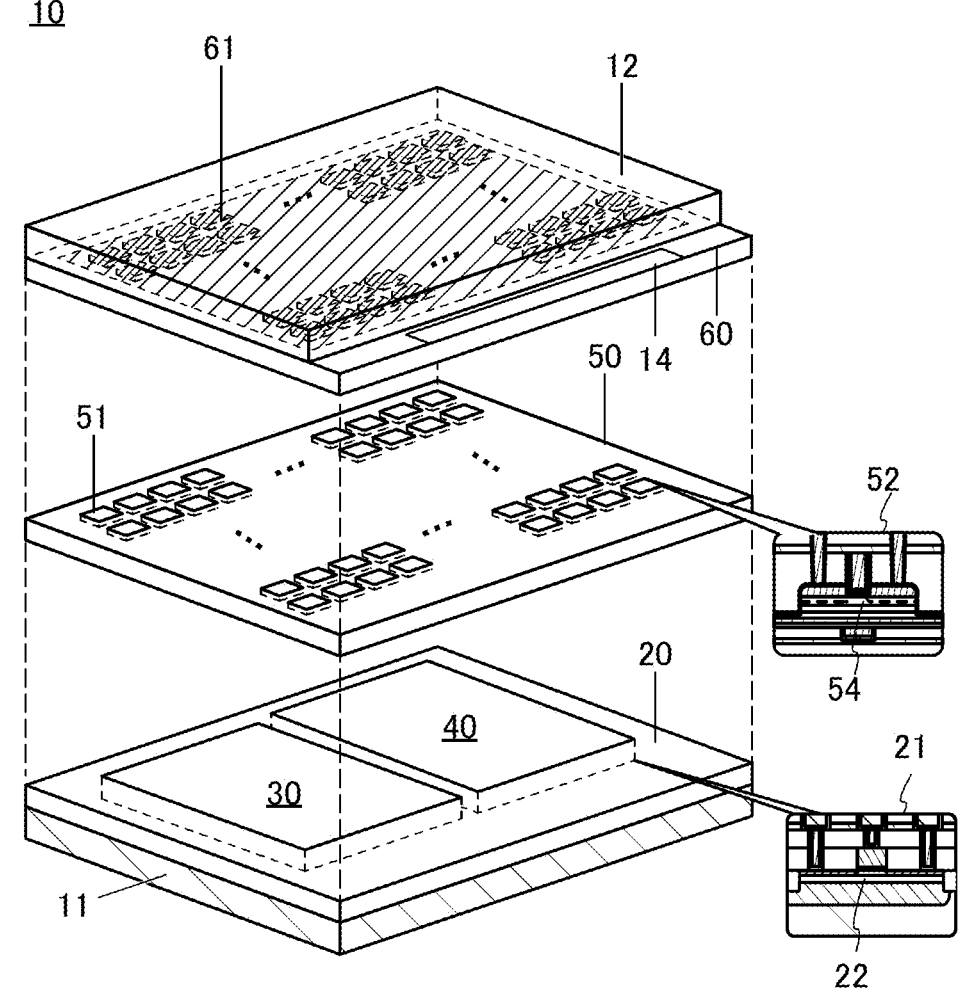

FIG. 1B is a perspective view schematically illustrating structures of layers provided between the substrate 11 and the substrate 12.

A layer 20 is provided over the substrate 11. A driver circuit 30 and a functional circuit 40 are provided in the layer 20. The layer 20 includes a transistor 21 containing silicon in a channel formation region 22 (such a transistor is also referred to as a Si transistor). The substrate 11 is, for example, a silicon substrate. A silicon substrate is preferable because it has higher thermal conductivity than a glass substrate.

The transistor 21 can be a transistor containing single crystal silicon in its channel formation region, for example. In particular, the use of a transistor containing single crystal silicon in a channel formation region as the transistor provided in the layer 20 can increase the on-state current of the transistor. This is preferable because circuits included in the layer 20 can be driven at high speed. The Si transistor can be formed by microfabrication to have a channel length of 3 nm to 10 nm, for example; thus, the display device 10 can be provided with a CPU, an accelerator such as a GPU, an application processor, or the like.

The driver circuit 30 includes a gate driver circuit, a source driver circuit, or the like, for example. In addition, an arithmetic circuit, a memory circuit, a power supply circuit, or the like may be included. Since the gate driver circuit, the source driver circuit, and other circuits can be placed to overlap with the display portion 13, the width of a non-display region (also referred to as a bezel) provided along the outer periphery of the display portion 13 of the display device 10 can be extremely narrow compared with the case where these circuits are placed in the same plane as the display portion 13, whereby the display device 10 with a small size can be achieved.

The functional circuit 40 has a function of application processor for controlling the circuits in the display device 10 and generating signals used for controlling the circuits, for example. The functional circuit 40 may include a CPU and a circuit used for correcting image data, such as an accelerator (e.g., a GPU). The functional circuit 40 may include an LVDS (Low Voltage Differential Signaling) circuit, an MIPI (Mobile Industry Processor Interface) circuit, and/or a D/A (Digital to Analog) converter circuit, for example, having a function of interface for receiving image data or the like from the outside of the display device 10. The functional circuit may include a circuit for compressing and decompressing image data and/or a power supply circuit, for example.

A layer 50 is provided over the layer 20. The layer 50 is provided with a plurality of pixel circuits 51. The layer 50 includes a transistor 52 containing a metal oxide (also referred to as an oxide transistor) in a channel formation region 54 (such a transistor is also referred to as an OS transistor). Note that the layer 50 can be stacked over the layer 20. The layer 50 may be formed over another substrate and bonded to the layer 20.

It is preferable to use, as the transistor 52 which is an OS transistor, a transistor including an oxide containing at least one of indium, an element M (the element M is aluminum, gallium, yttrium, or tin), and zinc in a channel formation region. Such an OS transistor has a characteristic of an extremely low off-state current. Thus, it is particularly preferable to use the OS transistor as a transistor provided in a pixel circuit, in which case analog data written to the pixel circuit can be retained for a long period.

A layer 60 is provided over the layer 50. Over the layer 60, the substrate 12 is provided. The substrate 12 is preferably a light-transmitting substrate or a layer formed of a light-transmitting material. The layer 60 includes a plurality of display elements 61. The layer 60 can be stacked over the layer 50. As the display element 61, an organic electroluminescent element (also referred to as an organic EL element) or the like can be used, for example. However, the display element 61 is not limited thereto, and an inorganic EL element formed of an inorganic material may be used, for example. Note that an "organic EL element" and an "inorganic EL element" are collectively referred to as "EL element" in some cases. The display element 61 may contain an inorganic compound such as quantum dots. For example, when used for the light-emitting layer, the quantum dots can function as a light-emitting material.

Figure 2B:
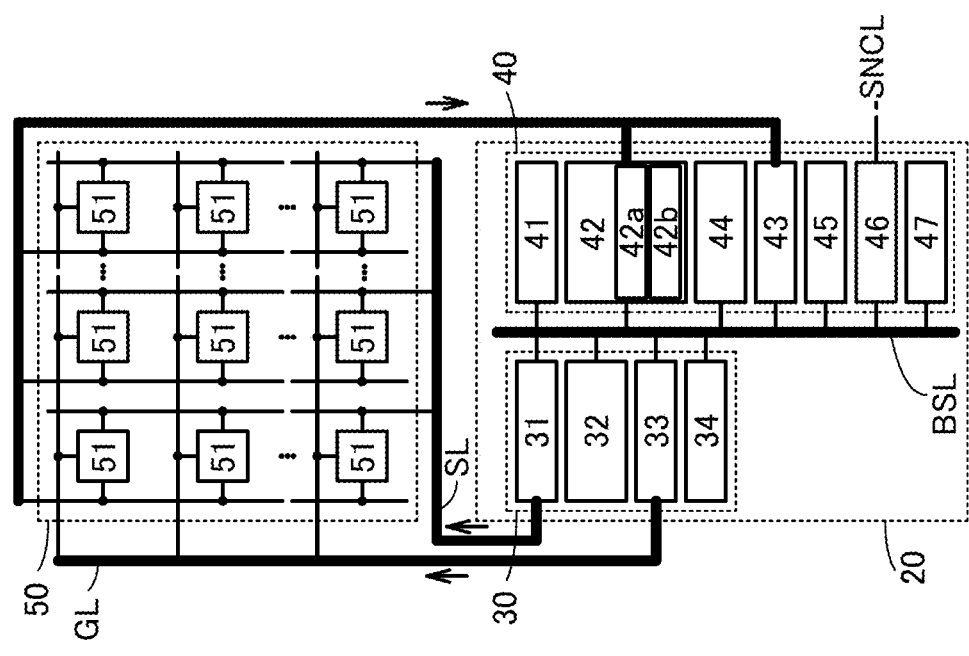
FIG. 2A and FIG. 2B are diagrams illustrating a structure example of a display device.
Figure 2A:
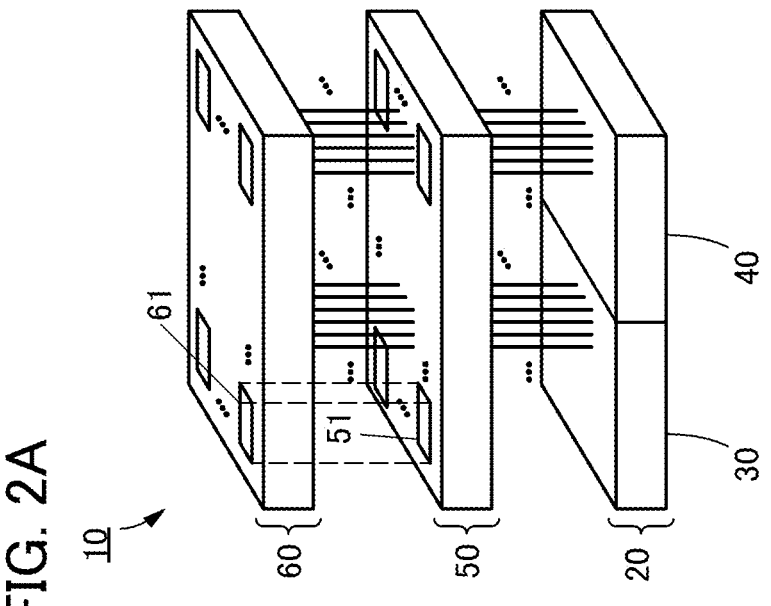

FIG. 2A is a block diagram schematically showing the display device 10 illustrated in FIG. 1A and FIG. 1B. As shown in FIG. 2A, the display device 10 of one embodiment of the present invention can have a structure in which the display elements 61, the pixel circuits 51, the driver circuit 30, and the functional circuit 40 are stacked; thus, the aperture ratio (effective display area ratio) of the pixels can be significantly increased. For example, the pixel aperture ratio can be greater than or equal to 40% and less than 100%, preferably greater than or equal to 50% and less than or equal to 95%, and further preferably greater than or equal to 60% and less than or equal to 95%. Furthermore, the pixel circuits 51 can be arranged extremely densely, and thus the resolution of the pixels can be extremely high. For example, the pixels can be arranged in the display portion of the display device 10 (a region where the pixel circuits 51 and the display elements 61 are stacked) with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

The display device 10 described above has extremely high resolution, and thus can be suitably used for a device for VR such as a head-mounted display or a glasses-type device for AR. For example, even in the case of a structure in which the display portion of the display device 10 is seen through a lens, pixels of the extremely-high-resolution display portion included in the display device 10 are not seen when the display portion is enlarged by the lens, so that display providing a high sense of immersion can be performed. Without limitation to the above, the display device 10 can also be suitably used for an electronic device having a relatively small display portion. For example, the display device 10 can be suitably used in a display portion of a wearable electronic device such as a smart watch.

In the case where a material containing single crystal silicon is used for the transistor 21 included in the layer 20 in the display device 10, the diagonal size of the display portion 13 can be greater than or equal to 0.1 inches and less than or equal to 5 inches, preferably greater than or equal to 0.5 inches and less than or equal to 3 inches, further preferably greater than or equal to 1 inch and less than or equal to 2 inches. The width of the bezel in the display device 10 of one embodiment of the present invention can be extremely narrow; in the case where the diagonal size of the substrate 11 over which the layer 20 is provided is 1 inch, for example, the amount of light to be obtained can be approximately four times larger than that of a case with a substrate with a diagonal size of 0.5 inches, which is suitable.

A specific configuration example of the driver circuit 30 and the functional circuit 40 will be described with reference to FIG. 2B. The display device 10 shown in FIG. 2B is a block diagram illustrating a plurality of wirings connecting pixel circuits 51, the driver circuit 30, and the functional circuit 40, a bus wiring, and the like.

In the display device 10 shown in FIG. 2B, the plurality of pixel circuits 51 are arranged in a matrix in the layer 50.

Furthermore, the driver circuit 30 and the functional circuit 40 are provided in the layer in the display device 10 shown in FIG. 2B. The driver circuit 30 includes, for example, a source driver circuit 31, a digital-to-analog converter circuit 32, a gate driver circuit 33, and a level shifter 34. The functional circuit 40 includes, for example, a memory device 41, a GPU (AI accelerator) 42, an EL correction circuit 43, a timing controller 44, a CPU 45, a sensor controller 46, and a power supply circuit 47. The functional circuit 40 has a function of an application processor.

In the display device 10 in FIG. 2B, for example, the bus wiring BSL is electrically connected to each of the circuits included in the driver circuit 30 and each of the circuits included in the functional circuit 40.

The source driver circuit 31 has a function of transmitting image data to the pixel circuit 51, for example. Thus, the source driver circuit 31 is electrically connected to the pixel circuit 51 through the wiring SL.

The digital-analog converter circuit 32 has a function of, for example, converting image data that has been digitally processed by a GPU described later, a correction circuit, or the like, into analog data. The image data converted into analog data is transmitted to the pixel circuit 51 via the source driver circuit 31. Note that the digital-analog converter circuit 32 may be included in the source driver circuit 31, or the image data may be transmitted to the source driver circuit 31, the digital-analog converter circuit 32, and the pixel circuit 51 in this order.

The gate driver circuit 33 has a function of selecting a circuit to which image data is to be transmitted in the pixel circuit 51, for example. Thus, the gate driver circuit 33 is electrically connected to the pixel circuit 51 through the wiring GL.

The level shifter 34 has a function of converting signals to be input to the source driver circuit 31, the digital-analog converter circuit 32, the gate driver circuit 33, and the like into signals having appropriate levels, for example.

The memory device 41 has a function of storing image data to be displayed by the pixel circuit 51, for example. Note that the memory device 41 can be configured to store the image data as digital data or analog data.

In the case where the memory device 41 stores image data, the memory device 41 is preferably a nonvolatile memory. In that case, a NAND memory or the like can be used as the memory device 41, for example.

In the case where the memory device 41 stores temporary data generated in the GPU 42, the EL correction circuit 43, the CPU 45, or the like, the memory device 41 is preferably a volatile memory. In that case, an SRAM (Static Random Access Memory), a DRAM (Dynamic Random Access Memory), or the like can be used as the memory device 41, for example.

The GPU 42 has a function of performing processing for outputting image data read from the memory device 41 to the pixel circuit 51, for example. Specifically, the GPU 42 is configured to perform pipeline processing in parallel and thus can perform high-speed processing of image data to be output to the pixel circuit 51. The GPU 42 can also has a function of a decoder for decoding an encoded image.

The functional circuit 40 may include a plurality of circuits that can improve the display quality of the display device 10. As such circuits, for example, correction (dimming and toning) circuits that detect color irregularity of a displayed image and correct the color irregularity to obtain an optimal image may be provided. In the case where the display element includes a light-emitting device including an organic EL material, the functional circuit 40 may be provided with an EL correction circuit. The functional circuit 40 includes, for example, the EL correction circuit 43.

The above-described image correction may be performed using artificial intelligence. For example, a current flowing in a pixel circuit (or a voltage applied to the pixel circuit) may be monitored and acquired, a displayed image may be acquired with an image sensor or the like, the current (or voltage) and the image may be used as input data in an arithmetic operation of the artificial intelligence (e.g., an artificial neural network), and the output result may be used to determine whether the image should be corrected.

Such an arithmetic operation of artificial intelligence can be applied to not only image correction but also upconversion processing (downconversion processing) of image data. As an example, FIG. 2B illustrates the GPU 42 that includes blocks for performing arithmetic operations for various kinds of correction (e.g., color irregularity correction 42a and upconversion 42b).

The timing controller 44 has a function of changing the frame rate at which an image is displayed, for example. For example, the display device 10 can be driven at a frame rate decreased by the timing controller 44 in the case where the display device 10 displays a still image; for another example, the display device 10 can be driven at a frame rate increased by the timing controller 44 in the case where the display device 10 displays a moving image.

The CPU 45 has a function of performing general-purpose processing such as execution of an operating system, control of data, and execution of various kinds of arithmetic operations or programs, for example. The CPU 45 has a function of, for example, giving an instruction for a writing operation or a reading operation of image data in the memory device 41, an operation for correcting image data, an operation for a later-described sensor, or the like. Furthermore, the CPU 45 may have a function of transmitting a control signal to at least one of the circuits included in the functional circuit 40, for example.

The sensor controller 46 has a function of controlling a sensor, for example. FIG. 2B illustrates a wiring SNCL as a wiring electrically connected to the sensor.

The sensor can be, for example, a touch sensor that can be provided in the display portion. Alternatively, the sensor can be an illuminance sensor, for example.

The power supply circuit 47 has a function of generating voltages to be supplied to the pixel circuits 51, the circuits included in the driver circuit 30 and the functional circuit 40, and the like. Note that the power supply circuit 47 may have a function of selecting a circuit to which voltage is to be supplied. The power supply circuit 47 can stop supply of voltage to the CPU 45, the GPU 42, and the like during a period in which a still image is displayed so that the power consumption of the whole display device 10 is reduced, for example.

As described above, the display device of one embodiment of the present invention can have a structure in which display elements, pixel circuits, a driver circuit, and a functional circuit are stacked. The driver circuit and a functional circuit, which are peripheral circuits, can be provided so as to overlap with the pixel circuits and thus the width of the bezel can be made extremely small, so that a reduction in size of the display device can be achieved. A structure of the display device of one embodiment of the present invention in which circuits are stacked enables its wirings connecting the circuits to be shortened, resulting in a reduction in weight of the display device. The display device of one embodiment of the present invention can include a display portion with a high pixel resolution; thus, the display device can have high display quality.

Figure 3A:
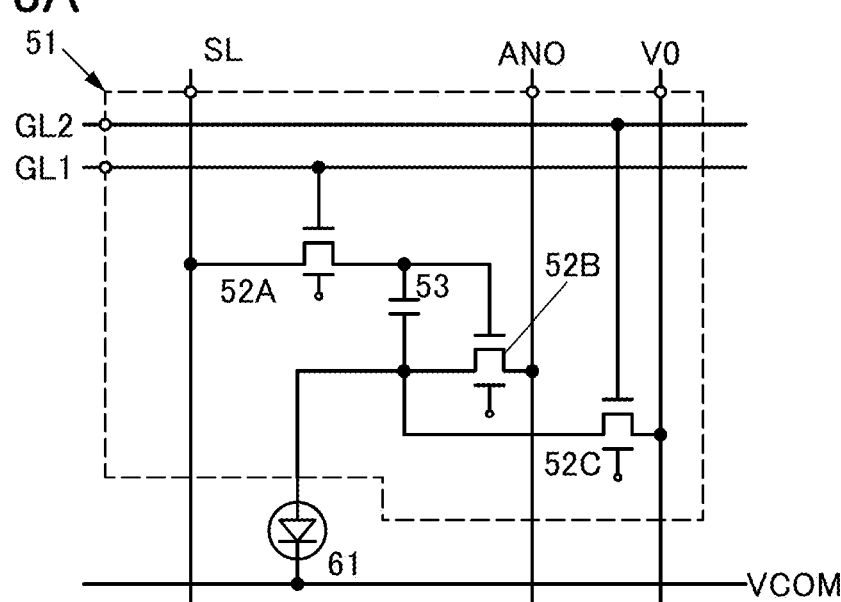
FIG. 3A and FIG. 3B are diagrams illustrating a structure example of a display device.
Figure 3B:
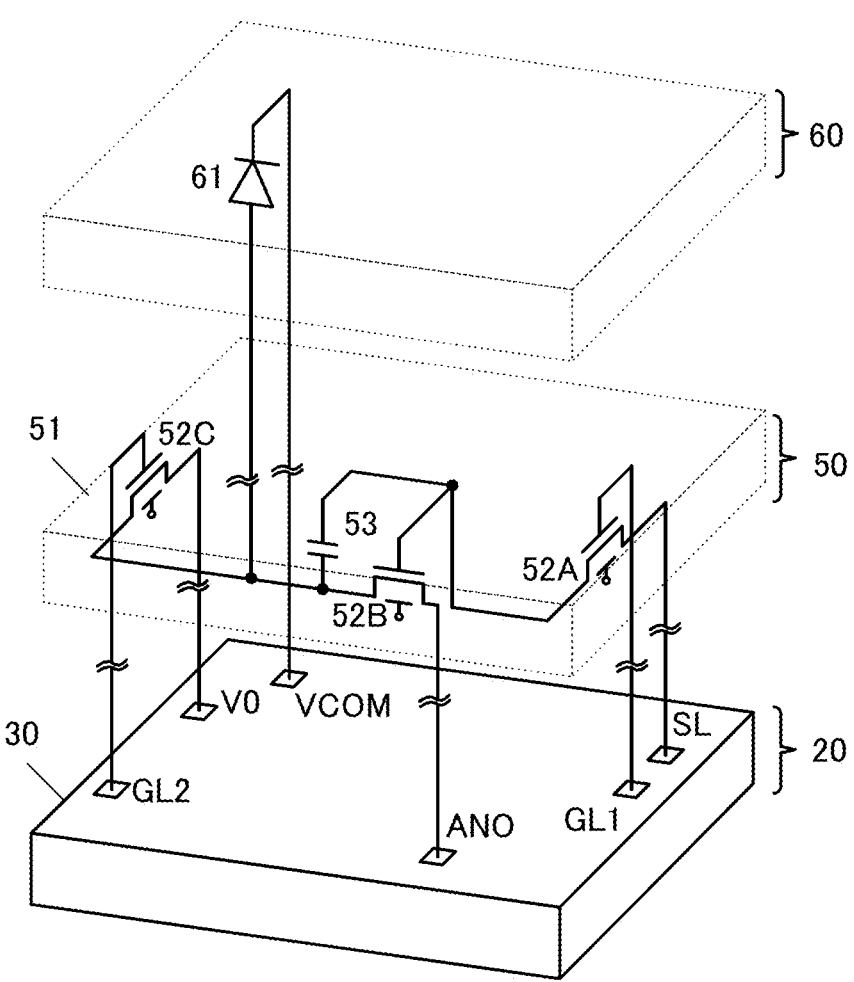

FIG. 3A and FIG. 3B illustrate a configuration example of the pixel circuit 51 and the display element 61 connected to the pixel circuit 51. FIG. 3A schematically illustrates the connection relation of the elements, and FIG. 3B schematically illustrates the vertical position relation of the layer 20 including the driver circuit, the layer 50 including a plurality of transistors of the pixel circuit, and the layer 60 including the light-emitting element.

The pixel circuit 51 illustrated as an example in FIG. 3A and FIG. 3B includes a transistor 52A, a transistor 52B, a transistor 52C, and a capacitor 53. The transistor 52A, the transistor 52B, and the transistor 52C can be OS transistors. Each of the OS transistors, the transistor 52A, the transistor 52B, and the transistor 52C, preferably includes a back gate electrode, in which case the structure in which the back gate electrode is supplied with the same signals as those supplied to the gate electrode or the structure in which the back gate electrode is supplied with signals different from those supplied to the gate electrode can be used.

The transistor 52B includes a gate electrode electrically connected to the transistor 52A, a first terminal electrically connected to the display element 61, and a second terminal electrically connected to a wiring ANO. The wiring ANO is a wiring for supplying a potential for supplying a current to the display element 61.

The transistor 52A includes a first terminal electrically connected to the gate electrode of the transistor 52B and a second terminal electrically connected to the wiring SL which functions as a source line, and has a function of controlling its conduction state or non-conduction state on the basis of the potential of a wiring GL1 which functions as a gate line.

The transistor 52C includes a first terminal electrically connected to a wiring V0 and a second terminal electrically connected to the display element 61, and has a function of controlling its conduction state or non-conduction state on the basis of the potential of a wiring GL2 which functions as a gate line. The wiring V0 is a wiring for supplying a reference potential and a wiring for outputting a current flowing through the pixel circuit 51 to the driver circuit 30 or the functional circuit 40.

The capacitor 53 includes a conductive film electrically connected to the gate electrode of the transistor 52B and a conductive film electrically connected to the second terminal of the transistor 52C.

The display element 61 includes a first electrode electrically connected to the first terminal of the transistor 52B and a second electrode electrically connected to a wiring VCOM. The wiring VCOM is a wiring for supplying a potential for supplying a current to the display element 61.

Accordingly, the intensity of light emitted from the display element 61 can be controlled in accordance with an image signal supplied to the gate electrode of the transistor 52B. Furthermore, variations in the gate-source voltage of the transistor 52B can be inhibited by the reference potential of the wiring V0 supplied through the transistor 52C.

A current value that can be used for setting of pixel parameters can be output from the wiring V0. Specifically, the wiring V0 can function as a monitor line for outputting a current flowing through the transistor 52B or current flowing through the display element 61 to the outside. A current output to the wiring V0 is converted into a voltage by a source follower circuit or the like and output to the outside. Alternatively, a current output to the wiring V0 can be converted into a digital signal by an A-D converter or the like and output to the functional circuit 40 or the like.

Note that the light-emitting element described in one embodiment of the present invention refers to a self-luminous display element such as an organic EL element (also referred to as an OLED (Organic Light Emitting Diode)). Note that the light-emitting element electrically connected to the pixel circuit can be a self-luminous light-emitting element such as an LED (Light Emitting Diode), a micro LED, a QLED (Quantum-dot Light Emitting Diode), or a semiconductor laser.

Note that in the structure illustrated as an example in FIG. 3B, the wirings electrically connecting the pixel circuit 51 and the driver circuit 30 can be shortened, so that wiring resistance of the wirings can be reduced. Thus, data can be written at high speed, which enables high-speed driving of the display device 10. Therefore, even when the number of the pixel circuits 51 included in the display device 10 is increased, a sufficiently long frame period can be ensured, and thus, the pixel density of the display device 10 can be increased. In addition, the increased pixel density of the display device 10 can increase the resolution of an image displayed by the display device 10. For example, the pixel density of the display device 10 can be higher than or equal to 1000 ppi, higher than or equal to 5000 ppi, or higher than or equal to 7000 ppi. Thus, the display device 10 can be, for example, a display device for AR or VR and can be suitably used in an electronic device with a short distance between the display portion and the user, such as an HMD.

Figures 4A, 4B:
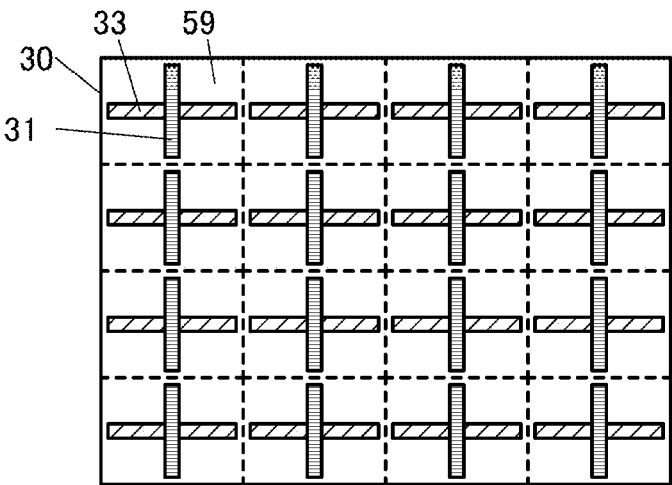
FIG. 4A and FIG. 4B are diagrams illustrating a structure example of a display device.

FIG. 4A illustrates an example of the driver circuit 30 provided to overlap with the pixel circuit 51. The source driver circuit 31 and the gate driver circuit 33 are shown as the driver circuit 30. The plurality of pixel circuits 51 (not illustrated) can be divided into a plurality of regions 59. Each of the regions 59 is provided in a region overlapping with the source driver circuit 31 and the gate driver circuit 33. The source driver circuit 31 and the gate driver circuit 33 can be divided into predetermined regions in the layer 20 and placed to correspond to the region 59.

FIG. 4B is an enlarged view of the region 59. In FIG. 4B, a plurality of wirings SL and a plurality of wirings GL are each shown by dashed lines.

In FIG. 4B, the plurality of wirings SL extending in the longitudinal direction are each electrically connected to the source driver circuit 31. The plurality of wirings GL extending in the lateral direction are each electrically connected to the gate driver circuit 33. The wirings SL and the wirings GL are each electrically connected to the plurality of pixel circuits 51.

In this manner, providing the plurality of source driver circuits 31 and gate driver circuits 33 just below the pixel circuit 51 enables the length of the wiring SL and the wiring GL to be extremely short. As a result, the load of the wiring SL and the wiring GL decreases, and the time and electric power required for charging and discharging can be drastically reduced, whereby high-speed driving can be achieved. Furthermore, rewrites of images can be performed for each of the regions 59, enabling only the data in a portion where the image has been changed to be rewritten and data without any change to be maintained, so that the power consumption can be reduced.

In addition, the pixel circuit 51, composed of OS transistors with an extremely low off-state current, can retain the data written to the pixel for a long period of time. Thus, the frame frequency of display can be set as desired (can be changed). Moreover, since the display device is capable of individually driving the regions 59, different frame frequencies can be set for different regions 59 in some cases.

In the display device of one embodiment of the present invention, the pixel circuit and the functional circuit can be stacked; thus, a defective pixel can be detected with the use of the functional circuit provided below the pixel circuit. Data on the defective pixel can be used to correct a display defect due to the defective pixel, leading to normal display.

Some or all of steps of a correction method described below as an example may be performed by a circuit provided outside the display device. Part of the correction method may be performed by the functional circuit 40 of the display device 10.

Figure 5A:
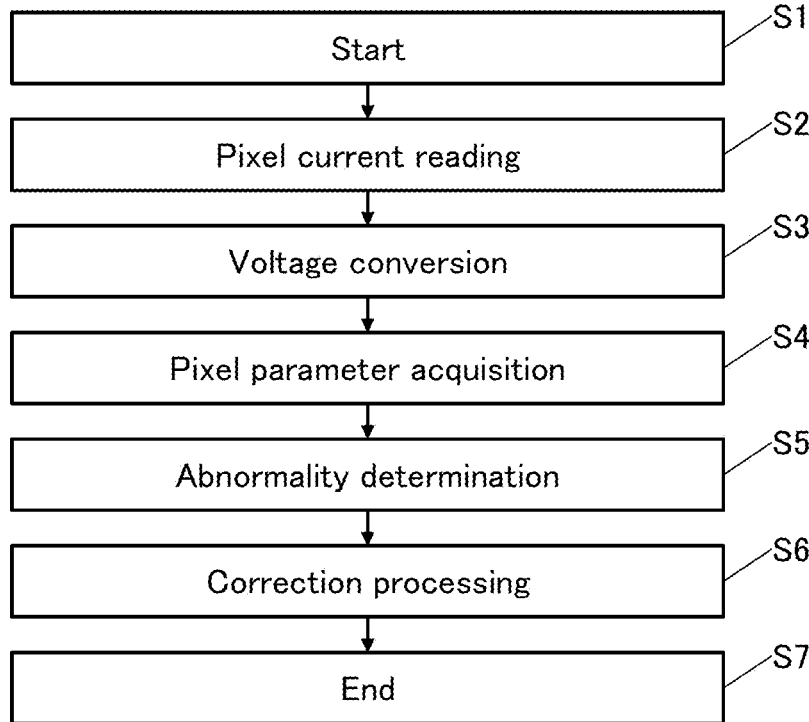
FIG. 5A and FIG. 5B are diagrams illustrating a structure example of a display device.

A more specific example of the correction method will be described below. FIG. 5A is a flow chart of the correction method described below.

First, the correction operation starts in Step S1.

Next, currents of the pixels are read in Step S2. For example, each of the pixels can be driven so as to output a current to a monitor line electrically connected to the pixel.

The current reading operations can be performed simultaneously in the plurality of regions 59. With the divided screen, the time required to read currents of all pixels can be extremely short.

Then, the read currents are converted into voltages in Step S3. In the case of using a digital signal in a subsequent process, conversion to digital data can be performed in Step S3. For example, analog data can be converted into digital data using an analog-digital converter circuit (ADC).

Next, pixel parameters of the pixels are obtained on the basis of the acquired data in Step S4. The pixel parameter includes the threshold voltage or field-effect mobility of the driving transistor, the threshold voltage of the light-emitting element, or a current value at a certain voltage, for example.

Subsequently, each of the pixels is determined to be abnormal or not on the basis of the pixel parameter in Step S5. For example, a pixel is determined to be abnormal when its pixel parameter has a value exceeding (or lower than) a predetermined threshold value.

An abnormal pixel is recognized as a dark spot defect when luminance is significantly lower than that corresponding to an input data potential, or recognized as a bright spot defect when luminance is significantly higher than that corresponding to an input data potential, for example.

The address of the abnormal pixel and the kind of the defect can be specified and acquired in Step S5.

Then, correction processing is performed in Step S6.

Figure 5B:
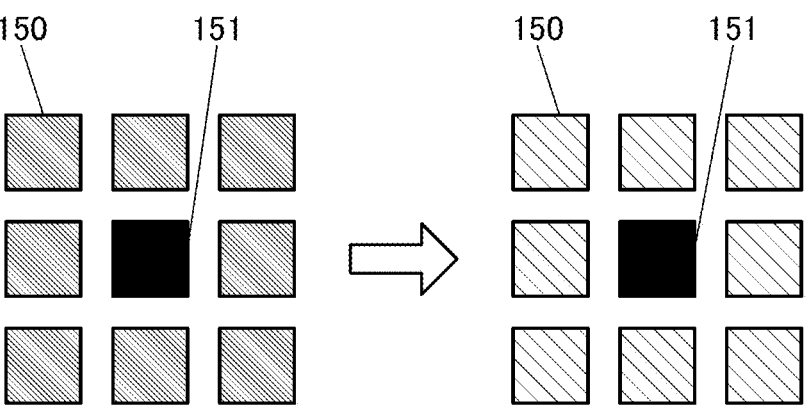

An example of the correction processing is described with reference to FIG. 5B. FIG. 5B schematically illustrates pixels arranged in a matrix of 3×3 each of which includes the pixel circuit 51 and the display element 61. Here, a pixel 151 at the center is regarded as a dark spot defect. FIG. 5B schematically illustrates a state where the pixel 151 is in a non-lighting state and pixels 150 around the pixel 151 are in lighting states with predetermined luminance.

A dark spot defect is due to a pixel unlikely to have normal luminance even when correction for increasing a data potential input to the pixel is performed. Hence, correction for increasing luminance is performed on the pixels 150 around the pixel 151 recognized as a dark spot defect, as illustrated in FIG. 5B. As a result, a normal image can be displayed even when a dark spot defect exists.

In the case of a bright spot defect, the luminance of pixels around the defect is decreased, so that the bright spot defect can be less noticeable.

Such a correction method for compensating for an abnormal pixel by pixels around the abnormal pixel is effective particularly in the case of a display device with a higher resolution (e.g., 1000 ppi or higher) because it is difficult to see individual pixels separately from each other.

It is preferred that correction be performed such that a data potential is not input to an abnormal pixel recognized as a dark spot defect, a bright spot defect, or the like.

As described above, a correction parameter can be set for each pixel. When the correction parameter is used for image data to be input, correction image data which enables the display device 10 to display an optimal image can be generated.

As well as in an abnormal pixel and pixels around the abnormal pixel, pixel parameters vary in pixels not determined to be abnormal; thus, display unevenness due to the variation might be recognized when an image is displayed, in some cases. Hence, correction parameters for the pixels not determined to be abnormal can be set so as to cancel (level off) the variation of the pixel parameters. For example, a reference value based on the mean value, average value, or the like of pixel parameters of some or all of the pixels can be set, and a correction value used for canceling a difference of a pixel parameter of a certain pixel from the reference value can be set as a correction parameter of the pixel.

For each of pixels around an abnormal pixel, it is preferred to set correction data that takes into consideration both a correction amount for compensating for the abnormal pixel and a correction amount for canceling pixel parameter variation.

Next, the correction operation terminates in Step S7.

After that, an image can be displayed on the basis of the correction parameters obtained in the correction operation and image data to be input.

Note that a neural network may be used for the correction operation. The neural network can determine correction parameters on the basis of inference results obtained by machine learning, for example. In the case where correction parameters are determined by a neural network, for example, high-accuracy correction can be performed to make an abnormal pixel less noticeable without using a detailed algorithm for correction.

The above is the description of the correction method.

Although FIG. 3A and FIG. 3B illustrate, as an example, the pixel circuit 51 including three transistors in total, one embodiment of the present invention is not limited thereto. Configuration examples and a driving method example of a pixel circuit which can be used for the pixel circuit 51 will be described below.

Figure 6A:
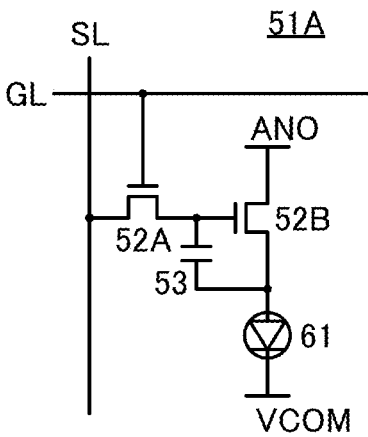
FIG. 6A to FIG. 6D are diagrams each illustrating a structure example of a display device.

A pixel circuit 51A illustrated in FIG. 6A includes the transistor 52A, the transistor 52B, and the capacitor 53. FIG. 6A illustrates the display element 61 connected to the pixel circuit 51A. The wiring SL, the wiring GL, the wiring ANO, and the wiring VCOM are electrically connected to the pixel circuit 51A.

In the transistor 52A, a gate is electrically connected to wiring GL, one of a source and a drain is electrically connected to the wiring SL, and the other thereof is electrically connected to a gate of the transistor 52B and one electrode of the capacitor 53. One of a source and a drain of the transistor 52B is electrically connected to the wiring ANO and the other thereof is electrically connected to an anode of the display element 61. The other electrode of the capacitor 53 is electrically connected to the anode of the display element 61. A cathode of the display element 61 is electrically connected to the wiring VCOM.

Figure 6B:
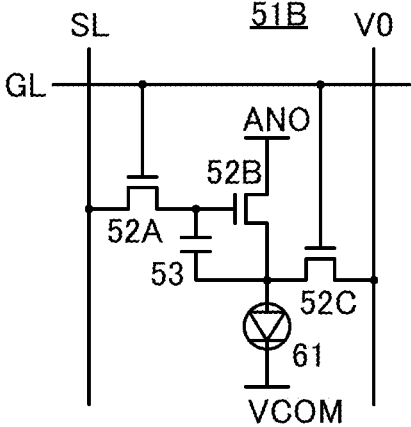

A pixel circuit 51B illustrated in FIG. 6B has a structure in which a transistor 52C is added to the pixel circuit 51A. In addition, the wiring V0 is electrically connected to the pixel circuit 51B.

Figure 6C:
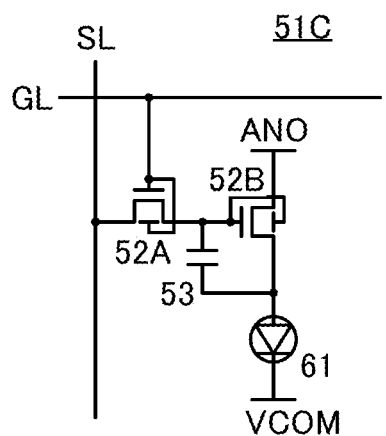
Figure 6D:
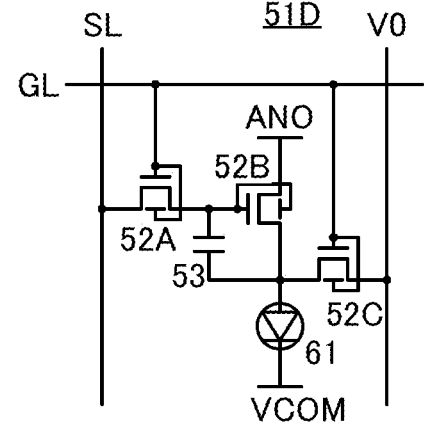

A pixel circuit 51C illustrated in FIG. 6C is an example in the case where a transistor in which a pair of gates are electrically connected to each other is used as each of the transistor 52A and the transistor 52B of the pixel circuit 51A. A pixel circuit 51D illustrated in FIG. 6D is an example in the case where such transistors are used in the pixel circuit 51B. Thus, the current that can flow through the transistor can be increased. Note that although a transistor with a pair of gates being electrically connected to each other is used for each of the transistors here, one embodiment of the present invention is not limited thereto. A transistor that includes a pair of gates electrically connected to different wirings may be used. When, for example, a transistor in which one of the gates is electrically connected to the source is used, the reliability can be increased.

Figure 7A:
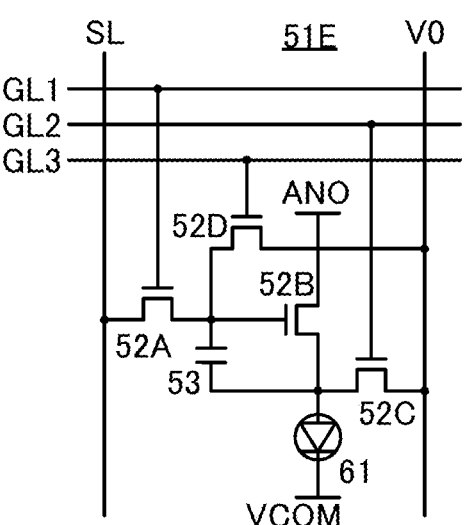
FIG. 7A to FIG. 7D are diagrams each illustrating a structure example of a display device.

A pixel circuit 51E illustrated in FIG. 7A has a structure in which a transistor 52D is added to the pixel circuit 51B. Three wirings (wiring GL1, wiring GL2, and wiring GL3) functioning as gate lines are electrically connected to the pixel circuit 51E.

A gate of the transistor 52D is electrically connected to the wiring GL3, one of a source and a drain of the transistor 52D is electrically connected to the gate of the transistor 52B, and the other of the source and the drain of the transistor 52D is electrically connected to the wiring V0. The gate of the transistor 52A is electrically connected to the wiring GL1, and the gate of the transistor 52C is electrically connected to the wiring GL2.

When the transistor 52C and the transistor 52D are turned on at the same time, the source and the gate of the transistor 52B have the same potential, so that the transistor 52B can be turned off. Thus, a current flowing to the display element 61 can be blocked forcibly. Such a pixel circuit is suitable for the case of using a display method in which a display period and an off period are alternately provided.

Figure 7B:
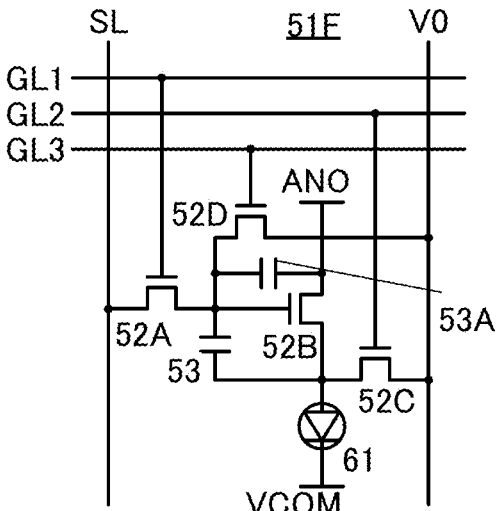

A pixel circuit 51F illustrated in FIG. 7B is an example in the case where a capacitor 53A is added to the pixel circuit 51E. The capacitor 53A functions as a storage capacitor.

Figure 7C:
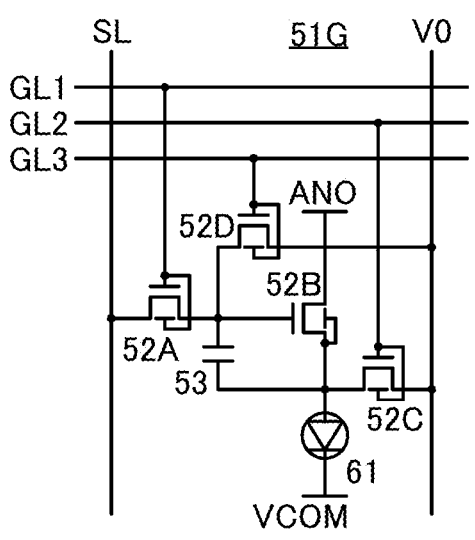
Figure 7D:
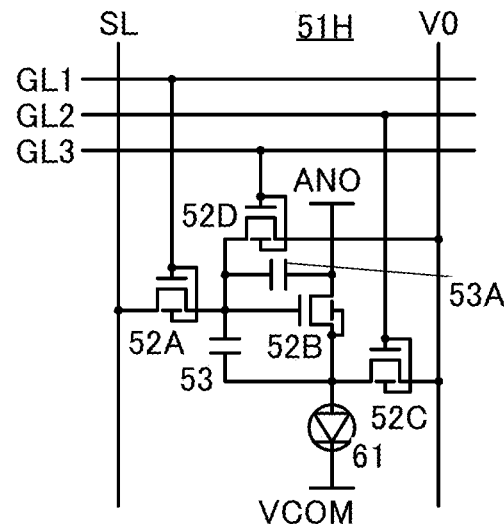

A pixel circuit 51G illustrated in FIG. 7C and a pixel circuit 51H illustrated in FIG. 7D are each an example in the case where a transistor including a pair of gates is used in the pixel circuit 51E or the pixel circuit 51F. A transistor in which a pair of gates are electrically connected to each other is used as each of the transistor 52A, the transistor 52C, and the transistor 52D, and a transistor in which one of gates is electrically connected to a source is used as the transistor 52B.

Next, an example of a method for driving a display device in which the pixel circuit 51E is used will be described. Note that a similar driving method can be applied to the pixel circuits 51F, 51G, and 51H.

Figure 8:
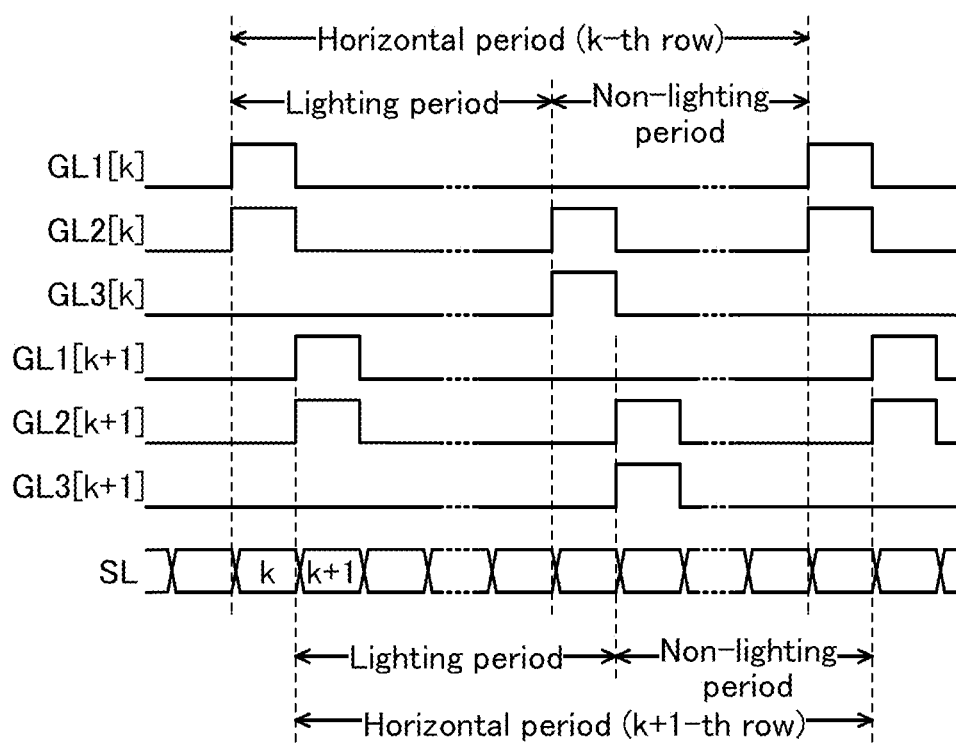
FIG. 8 is a diagram illustrating a structure example of a display device.

FIG. 8 shows a timing chart of a method for driving the display device in which the pixel circuit 51E is used. Changes in the potentials of wirings GL1[$k$], GL2[$k$], and GL3[$k$] that are gate lines of the k-th row and changes in the potentials of wirings GL1[$k$+1], GL2[$k$+1], and GL3[$k$+1] that are gate lines of the k+1-th row are shown here. FIG. 8 also shows the timing of supplying a signal to the wiring SL functioning as a source line.

Here, an example of the driving method in which one horizontal period is divided into a lighting period and a non-lighting period is shown. A horizontal period of the k-th row is shifted from a horizontal period of the k+1-th row by a selection period of the gate line.

In the lighting period of the k-th row, first, the wirings GL1[$k$] and GL2[$k$] are supplied with a high-level potential and the wiring SL is supplied with a source signal. Thus, the transistor 52A and the transistor 52C are turned on, so that a potential corresponding to the source signal is written from the wiring SL to the gate of the transistor 52B. After that, the wiring GL1[$k$] and the wiring GL2[$k$] are supplied with a low-level potential, so that the transistor 52A and the transistor 52C are turned off and the gate potential of transistor 52B is retained.

Subsequently, in a lighting period of the k+1-th row, data is written by operation similar to that described above.

Next, the non-lighting period is described. In the non-lighting period of the k-th row, the wiring GL2[$k$] and the wiring GL3[$k$] are supplied with a high-level potential. Accordingly, the transistor 52C and the transistor 52D are turned on, and the source and the gate of the transistor 52B are supplied with the same potential, so that almost no current flows through the transistor 52B. Thus, the display element 61 is turned off. All the subpixels that are positioned in the k-th row are turned off. The subpixels of the k-th row remain in the off state until the next lighting period.

Subsequently, in a non-lighting period of the k+1-th row, all the subpixels of the k+1-th row are turned off in a manner similar to that described above.

Such a driving method described above, in which the subpixels are not constantly on through one horizontal period and a non-lighting period is provided in one horizontal period, can be called duty driving. With duty driving, an afterimage phenomenon can be inhibited at the time of displaying moving images; therefore, a display device with high performance in displaying moving images can be achieved. Particularly in a VR device and the like, a reduction in an afterimage can reduce what is called VR sickness.

In the duty driving, the proportion of the lighting period in one horizontal period can be called a duty cycle. For example, a duty cycle of 50% means that the lighting period and the non-lighting period have the same lengths. Note that the duty cycle can be set freely and can be adjusted appropriately within a range higher than 0% and lower than or equal to 100%, for example.

A configuration different from the configurations of the above-described pixel circuits will be described with reference to FIG. 9A and FIG. 9B.

Figure 9A:
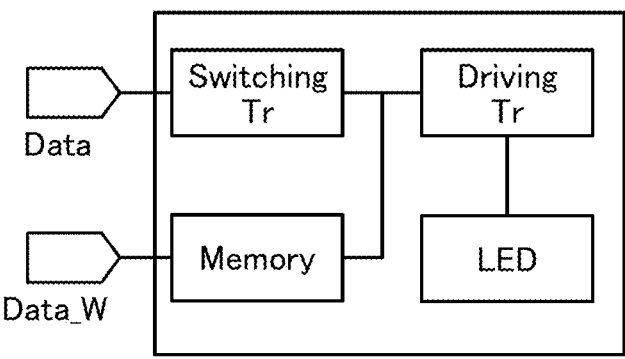
FIG. 9A and FIG. 9B are diagrams each illustrating a structure example of a display device.

FIG. 9A is a block diagram of an element included in the pixel circuit and a pixel including the light-emitting element. The pixel illustrated in FIG. 9A includes a memory in addition to a switching transistor (Switching Tr), a driving transistor (Driving Tr), and a light-emitting element (LED).

Data Data_W is supplied to the memory. When the data Data_W is supplied to the pixel in addition to display data Data, a current flowing through the light-emitting element becomes large, so that the display device can have high luminance.

Figure 9B:
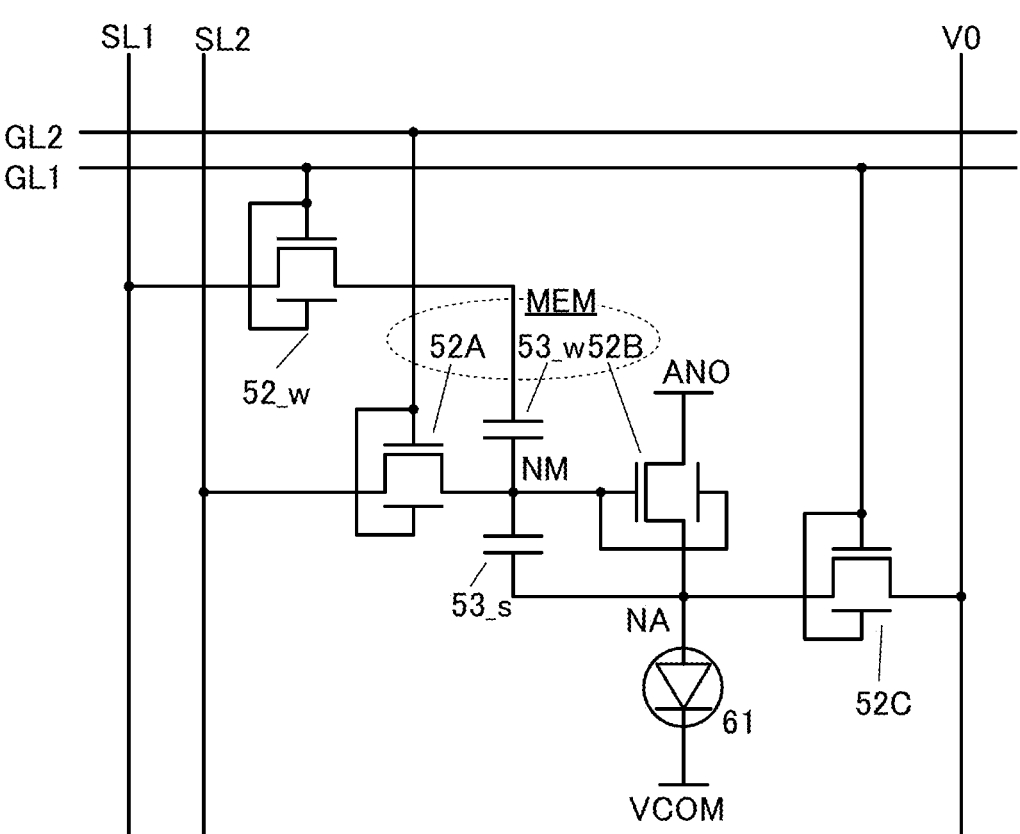

FIG. 9B is a specific circuit diagram of the pixel circuit.

A pixel circuit 521 illustrated in FIG. 9B includes a transistor 52_w, the transistor 52A, the transistor 52B, the transistor 52C, a capacitor 53_s, and a capacitor 53_w. FIG. 9B illustrates the display element 61 connected to the pixel circuit 51I.

One of a source and a drain of the transistor 52_w is electrically connected to one electrode of the capacitor 53_w. The other electrode of the capacitor 53_w is electrically connected to one of a source and a drain of the transistor 52A. The one of the source and the drain of the transistor 52A is electrically connected to a gate of the transistor 52B. The gate of the transistor 52B is electrically connected to one electrode of the capacitor 53_s. The other electrode of the capacitor 53_s is electrically connected to one of a source and a drain of the transistor 52B. The one of the source and the drain of the transistor 52B is electrically connected to one of a source and a drain of the transistor 52C. The one of the source and the drain of the transistor 52C is electrically connected to one electrode of the display element 61. The transistors illustrated in FIG. 9B each include a back gate electrically connected to its gate; however, the connection of the back gate is not limited thereto. The transistor does not have to include the back gate.

Here, a node to which the other electrode of the capacitor 53_w, the one of the source and the drain of the transistor 52A, the gate of the transistor 52B, and the one electrode of the capacitor 53_s are connected is referred to as a node NM. A node to which the other electrode of the capacitor 53_s, the one of the source and the drain of the transistor 52B, the one of the source and the drain of the transistor 52C, and the one electrode of the display element 61 are connected is referred to as a node NA.

A gate of the transistor 52_w is electrically connected to the wiring GL1. The gate of the transistor 52C is electrically connected to the wiring GL1. The gate of the transistor 52A is electrically connected to the wiring GL2. The other of the source and the drain of the transistor 52_w is electrically connected to a wiring SL1. The other of the source and the drain of the transistor 52C is electrically connected to the wiring V0. The other of the source and the drain of the transistor 52A is electrically connected to a wiring SL2.

The other of the source and the drain of the transistor 52B is electrically connected to the wiring ANO. The other electrode of the display element 61 is electrically connected to the wiring VCOM.

The wiring GL1 and the wiring GL2 can have a function of signal lines for controlling the operation of the transistors. The wiring SL1 can have a function of a signal line for supplying an image signal to the pixel. The wiring SL2 can have a function of a signal line for writing data to a memory circuit MEM. The wiring SL2 can have a function of a signal line for supplying a correction signal to the pixel. The wiring V0 has a function of a monitor line for obtaining the electrical characteristics of the transistor 52B. A specific potential is supplied from the wiring V0 to the other electrode of the capacitor 53_s through the transistor 52C, whereby writing of an image signal can be stable.

The transistor 52A, the transistor 52B, and the capacitor 53_w make up the memory circuit MEM. A node NM is a storage node; when the transistor 52_w is turned on, a signal supplied to the wiring SL2 can be written to the node NM. The use of an OS transistor with an extremely low off-state current as the transistor 52A allows the potential of the node NM to be retained for a long time.

In the pixel, the signal written to the node NM is capacitively coupled to the image signal supplied from the wiring SL1, and the resulting data can be output to the node NA. Note that the transistor 52_w can have a function of selecting a pixel.

In other words, when an intended correction signal is stored in the node NM in advance, the correction signal can be added to the supplied image signal. In this case, operation combined with the structure where the source driver circuit 31 and the gate driver circuit 33 are divided into predetermined regions in the layer 20 and operate in response to the divided region of the display portion, which is illustrated with reference to FIG. 4A and FIG. 4B, enables a structure where the correction signal is added only to the region in which the image data is updated so that the region is operated. Thus, a structure with lower power consumption can be obtained. Note that the correction signal is sometimes attenuated by a component on the transmission path; hence, the signal is preferably produced in consideration of the attenuation.

When the light-emitting element emits light with the use of the image signal and the correction signal, the amount of current flowing through the light-emitting device can be increased, and high luminance can be achieved. A voltage higher than or equal to the output voltage of the source driver circuit can be applied as the gate voltage of the driving transistor, so that the power consumption of the source driver circuit can be reduced. Since high-luminance light can be used for a light source, the sensitivity of the sensor can be increased.

At least part of the structure examples, the drawings corresponding thereto, and the like described in this embodiment as an example can be combined with the other structure examples, the other drawings, and the like as appropriate.

Embodiment 2

In this embodiment, the cross-sectional structure of the display device 10 of one embodiment of the present invention will be described.

Figure 10:
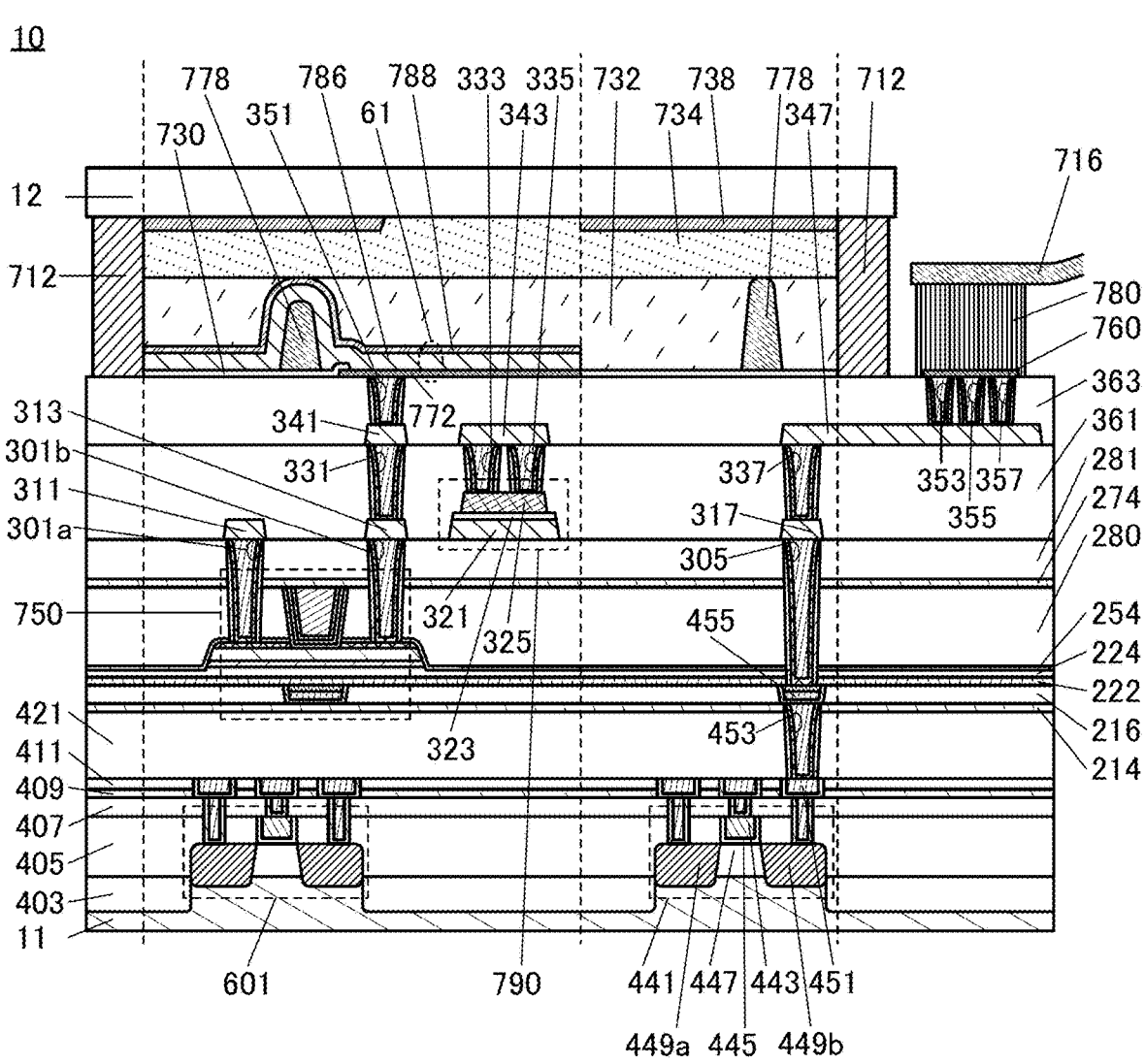
FIG. 10 is a diagram illustrating a structure example of a display device.

FIG. 10 is a cross-sectional view illustrating a structure example of the display device 10. The display device 10 includes a substrate 11 and a substrate 12, and the substrate 11 and the substrate 12 are attached to each other with a sealant 712.

As the substrate 11, a single crystal semiconductor substrate such as a single crystal silicon substrate can be used. Note that a semiconductor substrate other than a single crystal semiconductor substrate may be used as the substrate 11.

A transistor 441 and a transistor 601 are provided on the substrate 11. The transistor 441 and the transistor 601 can each be the transistor 21 provided in the layer 20 described in Embodiment 1.

The transistor 441 is formed of a conductor 443 functioning as a gate electrode, an insulator 445 functioning as a gate insulator, and part of the substrate 11 and includes a semiconductor region 447 including a channel formation region, a low-resistance region 449a functioning as one of a source region and a drain region, and a low-resistance region 449b functioning as the other of the source region and the drain region. The transistor 441 can be a p-channel transistor or an n-channel transistor.

The transistor 441 is electrically isolated from other transistors by an element isolation layer 403. FIG. 10 illustrates the case where the transistor 441 and the transistor 601 are electrically isolated from each other by the element isolation layer 403. The element isolation layer 403 can be formed by a LOCOS (local oxidation of silicon) method, an STI (shallow trench isolation) method, or the like.

Here, in the transistor 441 illustrated in FIG. 10, the semiconductor region 447 has a projecting shape. Moreover, the conductor 443 is provided to cover the side surface and the top surface of the semiconductor region 447 with the insulator 445 therebetween. Note that FIG. 10 does not illustrate the state where the conductor 443 covers the side surface of the semiconductor region 447. A material adjusting the work function can be used for the conductor 443.

A transistor having a projecting semiconductor region, like the transistor 441, can be referred to as a fin-type transistor because a projecting portion of a semiconductor substrate is used. An insulator functioning as a mask for forming a projecting portion may be provided in contact with the top surface of the projecting portion. Although FIG. 10 illustrates the structure in which the projecting portion is formed by processing part of the substrate 11, a semiconductor having a projecting shape may be formed by processing an SOI substrate.

Note that the structure of the transistor 441 illustrated in FIG. 10 is only an example; the structure of the transistor 441 is not limited thereto and can be changed as appropriate in accordance with the circuit structure, an operation method of the circuit, or the like. For example, the transistor 441 may be a planar transistor.

The transistor 601 can have a structure similar to that of the transistor 441.

An insulator 405, an insulator 407, an insulator 409, and an insulator 411 are provided over the substrate 11, in addition to the element isolation layer 403 and the transistors 441 and 601. A conductor 451 is embedded in the insulator 405, the insulator 407, the insulator 409, and the insulator 411. Here, the top surface of the conductor 451 and the top surface of the insulator 411 can be substantially level with each other.

An insulator 421 and an insulator 214 are provided over the conductor 451 and the insulator 411. A conductor 453 is embedded in the insulator 421 and the insulator 214. Here, the top surface of the conductor 453 and the top surface of the insulator 214 can be substantially level with each other.

An insulator 216 is provided over the conductor 453 and the insulator 214. A conductor 455 is embedded in the insulator 216. Here, the top surface of the conductor 455 and the top surface of the insulator 216 can be substantially level with each other.

An insulator 222, an insulator 224, an insulator 254, an insulator 280, an insulator 274, and an insulator 281 are provided over the conductor 455 and the insulator 216. A conductor 305 is embedded in the insulator 222, the insulator 224, the insulator 254, the insulator 280, the insulator 274, and the insulator 281. Here, the top surface of the conductor 305 and the top surface of the insulator 281 can be substantially level with each other.

An insulator 361 is provided over the conductor 305 and the insulator 281. A conductor 317 and a conductor 337 are embedded in the insulator 361. Here, the top surface of the conductor 337 and the top surface of the insulator 361 can be substantially level with each other.

An insulator 363 is provided over the conductor 337 and the insulator 361. A conductor 347, a conductor 353, a conductor 355, and a conductor 357 are embedded in the insulator 363. Here, the top surfaces of the conductor 353, the conductor 355, and the conductor 357 and the top surface of the insulator 363 can be substantially level with each other.

A connection electrode 760 is provided over the conductor 353, the conductor 355, the conductor 357, and the insulator 363. In addition, an anisotropic conductor 780 is provided to be electrically connected to the connection electrode 760, and a flexible printed circuit (FPC) 716 is provided to be electrically connected to the anisotropic conductor 780. A variety of signals and the like are supplied to the display device 10 from the outside of the display device 10 through the FPC 716.

As illustrated in FIG. 10, the low-resistance region 449b having a function of the other of the source region and the drain region of the transistor 441 is electrically connected to the FPC 716 through the conductor 451, the conductor 453, the conductor 455, the conductor 305, the conductor 317, the conductor 337, the conductor 347, the conductor 353, the conductor 355, the conductor 357, the connection electrode 760, and the anisotropic conductor 780. Although FIG. illustrates three conductors of the conductor 353, the conductor 355, and the conductor 357 as conductors that electrically connect the connection electrode 760 and the conductor 347, one embodiment of the present invention is not limited thereto. The number of conductors having a function of electrically connecting the connection electrode 760 and the conductor 347 may be one, two, or four or more. Providing a plurality of conductors having a function of electrically connecting the connection electrode 760 and the conductor 347 can reduce the contact resistance.

A transistor 750 is provided over the insulator 214. The transistor 750 can be the transistor 52 provided in the layer 50 described in Embodiment 1. For example, the transistor 750 can be the transistor provided in the pixel circuit 51. An OS transistor can be suitably used as the transistor 750. The OS transistor has a feature of an extremely low off-state current. Consequently, the retention time for image data or the like can be increased, so that the frequency of the refresh operation can be reduced. Thus, power consumption of the display device 10 can be reduced.

A conductor 301a and a conductor 301b are embedded in the insulator 254, the insulator 280, the insulator 274, and the insulator 281. The conductor 301a is electrically connected to one of a source and a drain of the transistor 750, and the conductor 301b is electrically connected to the other of the source and the drain of the transistor 750. Here, the top surfaces of the conductor 301a and the conductor 301b and the top surface of the insulator 281 can be substantially level with each other.

A conductor 311, a conductor 313, a conductor 331, a capacitor 790, a conductor 333, and a conductor 335 are embedded in the insulator 361. The conductor 311 and the conductor 313 are electrically connected to the transistor 750 and have a function of a wiring. The conductor 333 and the conductor 335 are electrically connected to the capacitor 790. Here, the top surfaces of the conductor 331, the conductor 333, and the conductor 335 and the top surface of the insulator 361 can be substantially level with each other.

A conductor 341, a conductor 343, and a conductor 351 are embedded in the insulator 363. Here, the top surface of the conductor 351 and the top surface of the insulator 363 can be substantially level with each other.

The insulator 405, the insulator 407, the insulator 409, the insulator 411, the insulator 421, the insulator 214, the insulator 280, the insulator 274, the insulator 281, the insulator 361, and the insulator 363 have a function of an interlayer film and may also have a function of a planarization film that covers unevenness thereunder. For example, the top surface of the insulator 363 may be planarized by planarization treatment using a chemical mechanical polishing (CMP) method or the like to have the increased evenness.

As illustrated in FIG. 10, the capacitor 790 includes a lower electrode 321 and an upper electrode 325. An insulator 323 is provided between the lower electrode 321 and the upper electrode 325. That is, the capacitor 790 has a stacked-layer structure in which the insulator 323 functioning as a dielectric is positioned between the pair of electrodes. Although FIG. 10 illustrates an example in which the capacitor 790 is provided over the insulator 281, the capacitor 790 may be provided over an insulator different from the insulator 281.

In the example illustrated in FIG. 10, the conductor 301a, the conductor 301b, and the conductor 305 are formed in the same layer. The conductor 311, the conductor 313, and the conductor 317 and the lower electrode 321 are formed in the same layer. The conductor 331, the conductor 333, the conductor 335, and the conductor 337 are formed in the same layer. The conductor 341, the conductor 343, and the conductor 347 are formed in the same layer. The conductor 351, the conductor 353, the conductor 355, and the conductor 357 are formed in the same layer. Forming a plurality of conductors in the same layer simplifies the manufacturing process of the display device 10 and thus the manufacturing cost of the display device 10 can be reduced. Note that these conductors may be formed in different layers or may contain different types of materials.

The display device 10 illustrated in FIG. 10 includes the display element 61. The display element 61 includes a conductor 772, an EL layer 786, and a conductor 788. The EL layer 786 contains an organic compound or an inorganic compound such as quantum dots.

Examples of materials that can be used as an organic compound include a fluorescent material and a phosphorescent material. Examples of materials that can be used as quantum dots include a colloidal quantum dot material, an alloyed quantum dot material, a core-shell quantum dot material, and a core quantum dot material.

The conductor 772 is electrically connected to the other of the source and the drain of the transistor 750 through the conductor 351, the conductor 341, the conductor 331, the conductor 313, and the conductor 301b. The conductor 772 is formed over the insulator 363 and has a function of a pixel electrode.

A material that transmits visible light or a material that reflects visible light can be used for the conductor 772. As a light-transmitting material, for example, an oxide material containing indium, zinc, tin, or the like is preferably used. As a reflective material, for example, a material containing aluminum, silver, or the like is preferably used.

Although not illustrated in FIG. 10, an optical member (optical substrate) such as a polarizing member, a retardation member, or an anti-reflection member can be provided in the display device 10 as appropriate, for example.

A light-blocking layer 738 and an insulator 734 that is in contact with the light-blocking layer 738 are provided on the substrate 12. The light-blocking layer 738 has a function of blocking light emitted from adjacent regions. Alternatively, the light-blocking layer 738 has a function of preventing external light from reaching the transistor 750 or the like.

In the display device 10 illustrated in FIG. 10, an insulator 730 is provided over the insulator 363. Here, the insulator 730 can cover part of the conductor 772. Here, the display element 61 is a top-emission light-emitting element, which includes the conductor 788 having a light-transmitting property.

The light-blocking layer 738 is provided to include a region overlapping with the insulator 730. The light-blocking layer 738 is covered with the insulator 734. A space between the display element 61 and the insulator 734 is filled with a sealing layer 732.

A component 778 is provided between the insulator 730 and the EL layer 786. Moreover, the component 778 is provided between the insulator 730 and the insulator 734.

Figure 11:
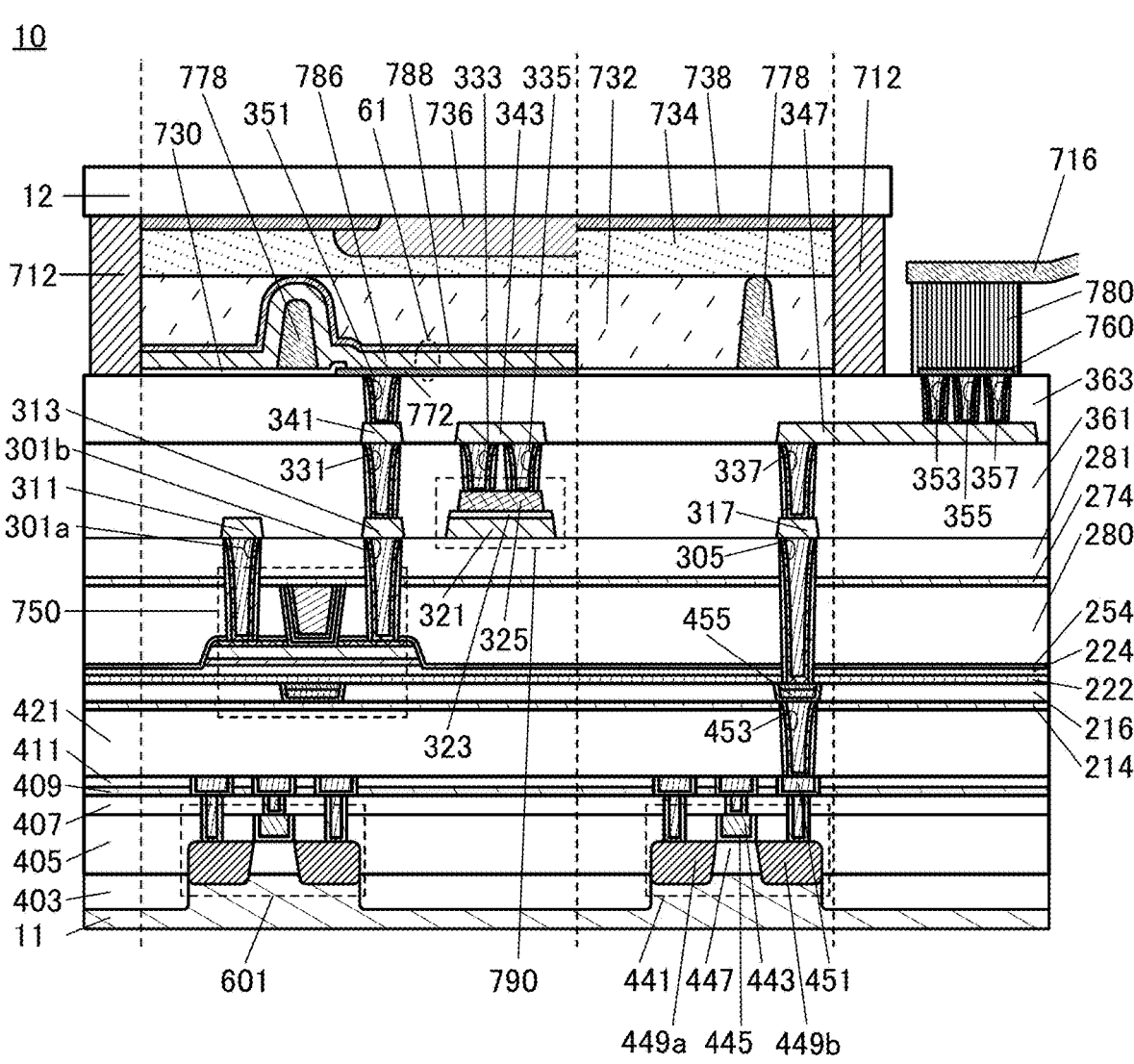
FIG. 11 is a diagram illustrating a structure example of a display device.

FIG. 11 illustrates a variation example of the display device 10 illustrated in FIG. 10. The display device 10 illustrated in FIG. 11 is different from the display device 10 illustrated in FIG. 10 in that a coloring layer 736 is provided. The coloring layer 736 is provided to include a region overlapping with the display element 61. Providing the coloring layer 736 can improve the color purity of light emitted from the display element 61. Thus, the display device 10 can display high-quality images. Furthermore, all the light-emitting elements 61, for example, in the display device 10 can be light-emitting elements emitting white light; hence, the EL layers 786 are not necessarily formed separately for each color, leading to higher resolution of the display device 10.

The display element 61 can have a micro-optical resonator (microcavity) structure. Thus, light of predetermined colors (e.g., RGB) can be extracted without a coloring layer, and the display device 10 can perform color display. The structure without a coloring layer can prevent light absorption by the coloring layer. As a result, the display device 10 can display high-luminance images, and power consumption of the display device 10 can be reduced. Note that a structure without a coloring layer can be employed even when the EL layer 786 is formed into an island shape for each pixel or formed into a stripe shape for each pixel column, i.e., the EL layers 786 are formed separately for each color. Note that the luminance of the display device 10 can be, for example, 500 cd/m$^2$ or higher, preferably higher than or equal to 1000 cd/m$^2$ and lower than or equal to 10000 cd/m$^2$, further preferably higher than or equal to 2000 cd/m$^2$ and lower than or equal to 5000 cd/m$^2$.

Structure Example of OS Transistor

FIG. 12A, FIG. 12B, and FIG. 12C are a top view and cross-sectional views of the transistor 750 that can be used in the display device of one embodiment of the present invention, and the periphery of the transistor 750. The transistor 750 can be used in the display device of one embodiment of the present invention.

FIG. 12A is the top view of the transistor 750. FIG. 12B and FIG. 12C are the cross-sectional views of the transistor 750. FIG. 12B is a cross-sectional view taken along dashed-dotted line A1-A2 in FIG. 12A, which corresponds to a cross-sectional view of the transistor 750 in the channel length direction. FIG. 12C is a cross-sectional view taken along the dashed-dotted line A3-A4 in FIG. 12A, which corresponds to a cross-sectional view of the transistor 750 in the channel width direction. Note that for simplification of the drawing, some components are not illustrated in the top view in FIG. 12A.

As illustrated in FIG. 12, the transistor 750 includes a metal oxide 230a placed over a substrate (not illustrated); a metal oxide 230b placed over the metal oxide 230a; a conductor 242a and a conductor 242b that are placed apart from each other over the metal oxide 230b; the insulator 280 that is placed over the conductor 242a and the conductor 242b and has an opening between the conductor 242a and the conductor 242b; a conductor 260 placed in the opening; an insulator 250 placed between the conductor 260 and the metal oxide 230b, the conductor 242a, the conductor 242b, and the insulator 280; and a metal oxide 230c placed between the insulator 250 and the metal oxide 230b, the conductor 242a, the conductor 242b, and the insulator 280. Here, as illustrated in FIG. 12B and FIG. 12C, the top surface of the conductor 260 is substantially aligned with the top surfaces of the insulator 250, the insulator 254, the metal oxide 230c, and the insulator 280. Hereinafter, the metal oxide 230a, the metal oxide 230b, and the metal oxide 230c may be collectively referred to as a metal oxide 230. The conductor 242a and the conductor 242b may be collectively referred to as a conductor 242.

In the transistor 750 illustrated in FIG. 12, the side surfaces of the conductor 242a and the conductor 242b on the conductor 260 side are substantially perpendicular. Note that the transistor 750 illustrated in FIG. 12 is not limited thereto, and the angle formed between the side surface and the bottom surface of the conductor 242a and the conductor 242b may range from 10° to 80°, preferably from 30° to 60°. The side surfaces of the conductor 242a and the conductor 242b that face each other may have a plurality of surfaces.

As illustrated in FIG. 12, the insulator 254 is preferably provided between the insulator 280 and the insulator 224, the metal oxide 230a, the metal oxide 230b, the conductor 242a, the conductor 242b, and the metal oxide 230c. Here, as illustrated in FIG. 12B and FIG. 12C, the insulator 254 is preferably in contact with the side surface of the metal oxide 230c, the top surface and the side surface of the conductor 242a, the top surface and the side surface of the conductor 242b, the side surfaces of the metal oxide 230a and the metal oxide 230b, and the top surface of the insulator 224.

In the transistor 750, three layers of the metal oxide 230a, the metal oxide 230b, and the metal oxide 230c are stacked in and around the region where the channel is formed (hereinafter also referred to as channel formation region); however, the present invention is not limited thereto. For example, a two-layer structure of the metal oxide 230b and the metal oxide 230c or a stacked-layer structure of four or more layers may be employed. Although the conductor 260 has a two-layer structure in the transistor 750, the present invention is not limited thereto. For example, the conductor 260 may have a single-layer structure or a stacked-layer structure of three or more layers. Alternatively, each of the metal oxide 230a, the metal oxide 230b, and the metal oxide 230c may have a stacked-layer structure of two or more layers.

For example, when the metal oxide 230c has a stacked-layer structure including a first metal oxide and a second metal oxide over the first metal oxide, the first metal oxide preferably has a composition similar to that of the metal oxide 230b and the second metal oxide preferably has a composition similar to that of the metal oxide 230a.

Here, the conductor 260 functions as a gate electrode of the transistor and the conductor 242a and the conductor 242b function as a source electrode and a drain electrode. As described above, the conductor 260 is formed to be embedded in the opening of the insulator 280 and the region between the conductor 242a and the conductor 242b. Here, the positions of the conductor 260, the conductor 242a, and the conductor 242b with respect to the opening of the insulator 280 are selected in a self-aligned manner. That is, in the transistor 750, the gate electrode can be placed between the source electrode and the drain electrode in a self-aligned manner. Thus, the conductor 260 can be formed without an alignment margin, resulting in a reduction in the area occupied by the transistor 750. Accordingly, the display apparatus can have higher resolution. In addition, the display apparatus can have a narrow bezel.

As illustrated in FIG. 12, the conductor 260 preferably includes a conductor 260a provided on the inner side of the insulator 250 and a conductor 260b provided to be embedded on the inner side of the conductor 260a.

The transistor 750 preferably includes the insulator 214 placed over the substrate (not illustrated); the insulator 216 placed over the insulator 214; a conductor 205 placed to be embedded in the insulator 216; the insulator 222 placed over the insulator 216 and the conductor 205; and the insulator 224 placed over the insulator 222. The metal oxide 230a is preferably placed over the insulator 224.

The insulator 274 and the insulator 281 functioning as interlayer films are preferably placed over the transistor 750. Here, the insulator 274 is preferably placed in contact with the top surfaces of the conductor 260, the insulator 250, the insulator 254, the metal oxide 230c, and the insulator 280.

The insulator 222, the insulator 254, and the insulator 274 preferably have a function of inhibiting diffusion of hydrogen (e.g., a hydrogen atom, a hydrogen molecule, or the like). For example, the insulator 222, the insulator 254, and the insulator 274 preferably have a lower hydrogen permeability than the insulator 224, the insulator 250, and the insulator 280. Moreover, the insulator 222 and the insulator 254 preferably have a function of inhibiting diffusion of oxygen (e.g., at least one of an oxygen atom and an oxygen molecule). For example, the insulator 222 and the insulator 254 preferably have a lower oxygen permeability than the insulator 224, the insulator 250, and the insulator 280.

Here, the insulator 224, the metal oxide 230, and the insulator 250 are separated from the insulator 280 and the insulator 281 by the insulator 254 and the insulator 274. This can inhibit entry of excess oxygen or impurities such as hydrogen contained in the insulator 280 and the insulator 281 into the insulator 224, the metal oxide 230a, the metal oxide 230b, and the insulator 250.

A conductor 240 (a conductor 240a and a conductor 240b) that is electrically connected to the transistor 750 and functions as a plug is preferably provided. Note that an insulator 241 (an insulator 241a and an insulator 241b) is provided in contact with the side surface of the conductor 240 functioning as a plug. In other words, the insulator 241 is provided in contact with the inner wall of an opening in the insulator 254, the insulator 280, the insulator 274, and the insulator 281. A structure may be employed in which a first conductor of the conductor 240 is provided in contact with the side surface of the insulator 241 and a second conductor of the conductor 240 is provided on the inner side of the first conductor. Here, the top surface of the conductor 240 and the top surface of the insulator 281 can be substantially level with each other. Although the first conductor of the conductor 240 and the second conductor of the conductor 240 are stacked in the transistor 750, the present invention is not limited thereto. For example, the conductor 240 may have a single-layer structure or a stacked-layer structure of three or more layers. In the case where a component has a stacked-layer structure, layers may be distinguished by ordinal numbers corresponding to the formation order.

In the transistor 750, a metal oxide functioning as an oxide semiconductor (hereinafter also referred to as an oxide semiconductor) is preferably used for the metal oxide 230 including the channel formation region (the metal oxide 230a, the metal oxide 230b, and the metal oxide 230c). For example, it is preferable to use a metal oxide having a band gap of 2 eV or more, preferably 2.5 eV or more as the metal oxide to be the channel formation region of the metal oxide 230.

The metal oxide preferably contains at least indium (In) or zinc (Zn). In particular, the metal oxide preferably contains indium (In) and zinc (Zn). In addition to them, an element M is preferably contained. As the element M, one or more of aluminum (Al), gallium (Ga), yttrium (Y), tin (Sn), boron (B), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and cobalt (Co) can be used. In particular, the element M is preferably one or more of aluminum (Al), gallium (Ga), yttrium (Y), and tin (Sn). Furthermore, the element M preferably contains one or both of Ga and Sn.

As illustrated in FIG. 12B, the metal oxide 230b may have a smaller thickness in a region not overlapping with the conductor 242 than in a region overlapping with the conductor 242. The thin region is formed when part of the top surface of the metal oxide 230b is removed at the time of forming the conductor 242a and the conductor 242b. When a conductive film to be the conductor 242 is formed, a low-resistance region is sometimes formed on the top surface of the metal oxide 230b in the vicinity of the interface with the conductive film. Removing the low-resistance region positioned between the conductor 242a and the conductor 242b on the top surface of the metal oxide 230b in this manner can prevent formation of the channel in the region.

According to one embodiment of the present invention, a display device that includes small-size transistors and has high resolution can be provided. A display device that includes a transistor with a high on-state current and has high luminance can be provided. A display device that includes a transistor operating at high speed and thus operates at high speed can be provided. A display device that includes a transistor having stable electrical characteristics and is highly reliable can be provided. A display device that includes a transistor with a low off-state current and has low power consumption can be provided.

The structure of the transistor 750 that can be used in the display apparatus of one embodiment of the present invention is described in detail.

The conductor 205 is placed to include a region overlapping with the metal oxide 230 and the conductor 260. Furthermore, the conductor 205 is preferably provided to be embedded in the insulator 216.

The conductor 205 includes the conductors 205a, 205b, and 205c. The conductor 205a is provided in contact with the bottom surface and the side wall of the opening provided in the insulator 216. The conductor 205b is provided to be embedded in a recessed portion formed by the conductor 205a. Here, the level of the top surface of the conductor 205b is lower than the levels of the top surfaces of the conductor 205a and the insulator 216. The conductor 205c is provided in contact with the top surface of the conductor 205b and the side surface of the conductor 205a. Here, the top surface of the conductor 205c is substantially level with the top surfaces of the conductor 205a and the insulator 216. That is, the conductor 205b is surrounded by the conductor 205a and the conductor 205c.

The conductor 205a and the conductor 205c are preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the conductor 205a and the conductor 205c are preferably formed using a conductive material having a function of inhibiting diffusion of oxygen (e.g., at least one of an oxygen atom and an oxygen molecule).

When the conductors 205a and 205c are formed using a conductive material having a function of inhibiting diffusion of hydrogen, impurities such as hydrogen contained in the conductor 205b can be prevented from diffusing into the metal oxide 230 through the insulator 224 and the like. When the conductors 205a and 205c are formed using a conductive material having a function of inhibiting diffusion of oxygen, the conductivity of the conductor 205b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, the conductor 205a may be a single layer or a stacked layer of the above conductive materials. For example, titanium nitride may be used for the conductor 205a.

A conductive material containing tungsten, copper, or aluminum as its main component is preferably used for the conductor 205b. For example, tungsten may be used for the conductor 205b.

The conductor 260 sometimes functions as a first gate (also referred to as top gate) electrode. The conductor 205 sometimes functions as a second gate (also referred to as bottom gate) electrode. In that case, by changing a potential applied to the conductor 205 independently of a potential applied to the conductor 260, $V_{th}$ of the transistor 750 can be controlled. In particular, by applying a negative potential to the conductor 205, $V_{th}$ of the transistor 750 can be higher than 0 V and the off-state current can be reduced. Thus, a drain current at the time when a potential applied to the conductor 260 is 0 V can be lower in the case where a negative potential is applied to the conductor 205 than in the case where the negative potential is not applied to the conductor 205.

The conductor 205 is preferably provided to be larger than the channel formation region in the metal oxide 230. In particular, it is preferable that the conductor 205 extend beyond an end portion of the metal oxide 230 that intersects with the channel width direction, as illustrated in FIG. 12C. In other words, the conductor 205 and the conductor 260 preferably overlap with each other with the insulator positioned therebetween, in a region on the outer side of the side surface of the metal oxide 230 in the channel width direction.

With the above structure, the channel formation region in the metal oxide 230 can be electrically surrounded by electric fields of the conductor 260 functioning as the first gate electrode and electric fields of the conductor 205 functioning as the second gate electrode.

Furthermore, as illustrated in FIG. 12C, the conductor 205 extends to function as a wiring as well. However, without limitation to this structure, a structure in which a conductor functioning as a wiring is provided below the conductor 205 may be employed.

The insulator 214 preferably functions as a barrier insulating film that inhibits the entry of impurities such as water and hydrogen to the transistor 750 from the substrate side. Accordingly, it is preferable to use, for the insulator 214, an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (an insulating material through which the above impurities are less likely to pass). Alternatively, it is preferable to use an insulating material having a function of inhibiting diffusion of oxygen (e.g., at least one of an oxygen atom and an oxygen molecule) (an insulating material through which the oxygen is less likely to pass).

For example, aluminum oxide or silicon nitride is preferably used for the insulator 214. Accordingly, it is possible to inhibit diffusion of impurities such as water and hydrogen to the transistor 750 side from the substrate side through the insulator 214. Alternatively, it is possible to inhibit diffusion of oxygen contained in the insulator 224 and the like to the substrate side through the insulator 214.

The permittivity of each of the insulators 216, 280, and 281 functioning as an interlayer film is preferably lower than that of the insulator 214. When a material with a low permittivity is used for an interlayer film, the parasitic capacitance generated between wirings can be reduced. For example, for the insulators 216, 280, and 281, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like may be used as appropriate.

The insulators 222 and 224 have a function as a gate insulator.

Here, the insulator 224 in contact with the metal oxide 230 preferably releases oxygen by heating. In this specification, oxygen that is released by heating is referred to as excess oxygen in some cases. For example, silicon oxide, silicon oxynitride, or the like can be used as appropriate for the insulator 224. When an insulator containing oxygen is provided in contact with the metal oxide 230, oxygen vacancies in the metal oxide 230 can be reduced, leading to improved reliability of the transistor 750.

Specifically, an oxide material that releases part of oxygen by heating is preferably used for the insulator 224. An oxide that releases oxygen by heating is an oxide film in which the amount of released oxygen converted into oxygen atoms is greater than or equal to $1.0 \times 10^{18}$ atoms/cm³, preferably greater than or equal to $1.0 \times 10^{19}$ atoms/cm³, further preferably greater than or equal to $2.0 \times 10^{19}$ atoms/cm³ or greater than or equal to $3.0 \times 10^{20}$ atoms/cm³ in thermal desorption spectroscopy (TDS) analysis. Note that the temperature of the film surface in the TDS analysis is preferably in the range of 100° C. to 700° C. or 100° C. to 400° C.

As illustrated in FIG. 12C, the insulator 224 is sometimes thinner in a region overlapping with neither the insulator 254 nor the metal oxide 230b than in the other regions. In the insulator 224, the region overlapping with neither the insulator 254 nor the metal oxide 230b preferably has a thickness with which the above oxygen can be adequately diffused.

Like the insulator 214 or the like, the insulator 222 preferably functions as a barrier insulating film that inhibits the entry of impurities such as water and hydrogen into the transistor 750 from the substrate side. For example, the insulator 222 preferably has a lower hydrogen permeability than the insulator 224. When the insulator 224, the metal oxide 230, the insulator 250, and the like are surrounded by the insulator 222, the insulator 254, and the insulator 274, the entry of impurities such as water and hydrogen into the transistor 750 from outside can be inhibited.

Furthermore, it is preferable that the insulator 222 have a function of inhibiting diffusion of oxygen (e.g., at least one of an oxygen atom and an oxygen molecule) (it is preferable that the above oxygen be less likely to pass through the insulator 222). For example, the insulator 222 preferably has a lower oxygen permeability than the insulator 224. The insulator 222 preferably has a function of inhibiting diffusion of oxygen and impurities, in which case oxygen contained in the metal oxide 230 can be prevented from diffusing to the substrate side. Moreover, the conductor 205 can be inhibited from reacting with oxygen contained in the insulator 224 or the metal oxide 230.

As the insulator 222, an insulator containing an oxide of aluminum and/or an oxide of hafnium, which are insulating materials, is preferably used. For the insulator containing an oxide of aluminum and/or an oxide of hafnium, aluminum oxide, hafnium oxide, an oxide containing aluminum and hafnium (hafnium aluminate), or the like is preferably used. The insulator 222 formed using such a material functions as a layer inhibiting oxygen release from the metal oxide 230 and entry of impurities such as hydrogen into the metal oxide 230 from the periphery of the transistor 750.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

The insulator 222 may be a single layer or a stacked layer using an insulator containing a high-k material, such as aluminum oxide, hafnium oxide, tantalum oxide, zirconium oxide, lead zirconate titanate (PZT), strontium titanate (Sr-$TiO_3$), or (Ba,Sr)$TiO_3$ (BST). As miniaturization and high integration of transistors progress, a problem such as a leakage current may arise because of a thinner gate insulator. When a high-k material is used for the insulator functioning as a gate insulator, a gate potential at the time of operation of the transistor can be reduced while the physical thickness is maintained.

Note that the insulators 222 and 224 may each have a stacked-layer structure of two or more layers. In that case, without limitation to a stacked-layer structure formed of the same material, a stacked-layer structure formed of different materials may be employed. For example, an insulator similar to the insulator 224 may be provided below insulator 222.

The metal oxide 230 includes the metal oxide 230a, the metal oxide 230b over the metal oxide 230a, and the metal oxide 230c over the metal oxide 230b. When the metal oxide 230 includes the metal oxide 230a under the metal oxide 230b, it is possible to inhibit diffusion of impurities into the metal oxide 230b from the components formed below the metal oxide 230a. Moreover, when the metal oxide 230 includes the metal oxide 230c over the metal oxide 230b, it is possible to inhibit diffusion of impurities into the metal oxide 230b from the components formed above the metal oxide 230c.

Note that the metal oxide 230 preferably has a stacked-layer structure of a plurality of oxide layers that differ in the atomic ratio of metal atoms. For example, in the case where the metal oxide 230 contains at least indium (In) and an element M, the proportion of the number of atoms of the element M contained in the metal oxide 230a to the number of atoms of all elements that constitute the metal oxide 230a is preferably higher than the proportion of the number of atoms of the element M contained in the metal oxide 230b to the number of atoms of all elements that constitute the metal oxide 230b. In addition, the atomic ratio of the element M to In in the metal oxide 230a is preferably higher than the atomic ratio of the element M to In in the metal oxide 230b. Here, a metal oxide that can be used as the metal oxide 230a or the metal oxide 230b can be used as the metal oxide 230c.

The energy of the conduction band minimum of each of the metal oxide 230a and the metal oxide 230c is preferably higher than that of the metal oxide 230b. In other words, the electron affinity of each of the metal oxide 230a and the metal oxide 230c is preferably smaller than that of the metal oxide 230b. In that case, a metal oxide that can be used as the metal oxide 230a is preferably used as the metal oxide 230c. Specifically, the proportion of the number of atoms of the element M contained in the metal oxide 230c to the number of atoms of all elements that constitute the metal oxide 230c is preferably higher than the proportion of the number of atoms of the element M contained in the metal oxide 230b to the number of atoms of all elements that constitute the metal oxide 230b. In addition, the atomic ratio of the element M to In in the metal oxide 230c is preferably higher than the atomic ratio of the element M to In in the metal oxide 230b.

Here, the energy level of the conduction band minimum gently changes at junction portions between the metal oxide 230a, the metal oxide 230b, and the metal oxide 230c. In other words, the energy level of the conduction band minimum at junction portions between the metal oxide 230a, the metal oxide 230b, and the metal oxide 230c continuously changes or is continuously connected. This can be achieved by decreasing the density of defect states in a mixed layer formed at the interface between the metal oxide 230a and the metal oxide 230b and the interface between the metal oxide 230b and the metal oxide 230c.

Specifically, when the metal oxide 230a and the metal oxide 230b or the metal oxide 230b and the metal oxide 230c contain the same element (as a main component) in addition to oxygen, a mixed layer with a low density of defect states can be formed. For example, in the case where the metal oxide 230b is an In—Ga—Zn oxide, an In—Ga—Zn oxide, a Ga—Zn oxide, gallium oxide, or the like may be used as the metal oxide 230a and the metal oxide 230c. The metal oxide 230c may have a stacked-layer structure. For example, a stacked-layer structure of an In—Ga—Zn oxide and a Ga—Zn oxide over the In—Ga—Zn oxide or a stacked-layer structure of an In—Ga—Zn oxide and gallium oxide over the In—Ga—Zn oxide can be employed. In other words, the metal oxide 230c may have a stacked-layer structure of an In—Ga—Zn oxide and an oxide that does not contain In.

Specifically, as the metal oxide 230a, a metal oxide having an atomic ratio of In:Ga:Zn=1:3:4 or In:Ga:Zn=1:1:0.5 can be used. As the metal oxide 230b, a metal oxide having an atomic ratio of In:Ga:Zn=4:2:3 or In:Ga:Zn=3:1:2 can be used. As the metal oxide 230c, a metal oxide having an atomic ratio of In:Ga:Zn=1:3:4, In:Ga:Zn=4:2:3, Ga:Zn=2:1, or Ga:Zn=2:5 can be used. Specific examples of a stacked-layer structure of the metal oxide 230c include a stacked-layer structure of a layer having an atomic ratio of In:Ga:Zn=4:2:3 and a layer having an atomic ratio of Ga:Zn=2:1, a stacked-layer structure of a layer having an atomic ratio of In:Ga:Zn=4:2:3 and a layer having an atomic ratio of Ga:Zn=2:5, and a stacked-layer structure of a layer having an atomic ratio of In:Ga:Zn=4:2:3 and gallium oxide.

At this time, the metal oxide 230b serves as a main carrier path. When the metal oxide 230a and the metal oxide 230c have the above structure, the density of defect states at the interface between the metal oxide 230a and the metal oxide 230b and the interface between the metal oxide 230b and the metal oxide 230c can be made low. This reduces the influence of interface scattering on carrier conduction, and the transistor 750 can have a high on-state current and high frequency characteristics. Note that in the case where the metal oxide 230c has a stacked-layer structure, not only the effect of reducing the density of defect states at the interface between the metal oxide 230b and the metal oxide 230c, but also the effect of inhibiting diffusion of the constituent element of the metal oxide 230c to the insulator 250 side can be expected. Specifically, the metal oxide 230c has a stacked-layer structure in which the upper layer is an oxide that does not contain In, whereby the amount of In that would diffuse to the insulator 250 side can be reduced. Since the insulator 250 functions as a gate insulator, the transistor would show poor characteristics when In diffuses into the insulator 250. Thus, the metal oxide 230c having a stacked-layer structure allows a highly reliable display apparatus to be provided.

The conductor 242 (the conductor 242a and the conductor 242b) functioning as the source electrode and the drain electrode is provided over the metal oxide 230b. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even when absorbing oxygen.

When the conductor 242 is provided in contact with the metal oxide 230, the oxygen concentration of the metal oxide 230 in the vicinity of the conductor 242 sometimes decreases. In addition, a metal compound layer that contains the metal contained in the conductor 242 and the component of the metal oxide 230 is sometimes formed in the metal oxide 230 in the vicinity of the conductor 242. In such a case, the carrier density of the region in the metal oxide 230 in the vicinity of the conductor 242 increases, and the region becomes a low-resistance region.

Here, the region between the conductor 242a and the conductor 242b is formed to overlap with the opening of the insulator 280. Accordingly, the conductor 260 can be formed in a self-aligned manner between the conductor 242a and the conductor 242b.

The insulator 250 functions as a gate insulator. The insulator 250 is preferably placed in contact with the top surface of the metal oxide 230c. For the insulator 250, any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide can be used. In particular, silicon oxide and silicon oxynitride are preferable because of their thermal stability.

As in the insulator 224, the concentration of impurities such as water and hydrogen in the insulator 250 is preferably reduced. The thickness of the insulator 250 is preferably greater than or equal to 1 nm and less than or equal to 20 nm.

A metal oxide may be provided between the insulator 250 and the conductor 260. The metal oxide preferably inhibits oxygen diffusion from the insulator 250 into the conductor 260. Accordingly, oxidation of the conductor 260 due to oxygen in the insulator 250 can be inhibited.

The metal oxide functions as part of the gate insulator in some cases. Therefore, when silicon oxide, silicon oxynitride, or the like is used for the insulator 250, a metal oxide that is a high-k material with a high dielectric constant is preferably used as the metal oxide. When the gate insulator has a stacked-layer structure of the insulator 250 and the metal oxide, the stacked-layer structure can be thermally stable and have a high dielectric constant. Accordingly, a gate potential applied during operation of the transistor can be lowered while the physical thickness of the gate insulator is maintained. In addition, the equivalent oxide thickness (EOT) of the insulator functioning as the gate insulator can be reduced.

Specifically, a metal oxide containing one or more of hafnium, aluminum, gallium, yttrium, zirconium, tungsten, titanium, tantalum, nickel, germanium, magnesium, and the like can be used. It is preferable to use an insulator containing an oxide of one or both of aluminum and hafnium, such as aluminum oxide, hafnium oxide, or an oxide containing aluminum and hafnium (hafnium aluminate), in particular.

Although FIG. 12 illustrates the conductor 260 having a two-layer structure, the conductor 260 may have a single-layer structure or a stacked-layer structure of three or more layers.

The conductor 260a is preferably formed using the aforementioned conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the conductor 260a is preferably formed using a conductive material having a function of inhibiting diffusion of oxygen (e.g., at least one of an oxygen atom and an oxygen molecule).

When the conductor 260a has a function of inhibiting diffusion of oxygen, the conductivity of the conductor 260b can be inhibited from being lowered because of oxidation due to oxygen contained in the insulator 250. As a conductive material having a function of inhibiting oxygen diffusion, for example, tantalum, tantalum nitride, ruthenium, ruthenium oxide, or the like is preferably used.

Moreover, a conductive material containing tungsten, copper, or aluminum as its main component is preferably used for the conductor 260b. The conductor 260 also functions as a wiring and thus is preferably formed using a conductor having high conductivity. For example, a conductive material containing tungsten, copper, or aluminum as its main component can be used. The conductor 260b may have a stacked-layer structure, for example, a stacked-layer structure of any of the above conductive materials and titanium or titanium nitride.

As illustrated in FIG. 12A and FIG. 12C, the side surface of the metal oxide 230 is covered with the conductor 260 in a region where the metal oxide 230b does not overlap with the conductor 242, that is, the channel formation region of the metal oxide 230. Accordingly, electric fields of the conductor 260 functioning as the first gate electrode are likely to act on the side surface of the metal oxide 230. Hence, the transistor 750 can have a higher on-state current and higher frequency characteristics.

Like the insulator 214 or the like, the insulator 254 preferably functions as a barrier insulating film that inhibits the entry of impurities such as water and hydrogen into the transistor 750 from the insulator 280 side. The insulator 254 preferably has lower hydrogen permeability than the insulator 224, for example. Furthermore, as illustrated in FIG. 12B and FIG. 12C, the insulator 254 is preferably in contact with the side surface of the metal oxide 230c, the top and side surfaces of the conductor 242a, the top and side surfaces of the conductor 242b, the side surfaces of the metal oxide 230a and the metal oxide 230b, and the top surface of the insulator 224. Such a structure can inhibit the entry of hydrogen contained in the insulator 280 into the metal oxide 230 through the top surfaces or the side surfaces of the conductor 242a, the conductor 242b, the metal oxide 230a, the metal oxide 230b, and the insulator 224.

Furthermore, it is preferable that the insulator 254 have a function of inhibiting diffusion of oxygen (e.g., at least one of an oxygen atom and an oxygen molecule) (it is preferable that the above oxygen be less likely to pass through the insulator 254). For example, the insulator 254 preferably has lower oxygen permeability than the insulator 280 or the insulator 224.

The insulator 254 is preferably formed by a sputtering method. When the insulator 254 is formed by a sputtering method in an oxygen-containing atmosphere, oxygen can be added to the vicinity of a region of the insulator 224 which is in contact with the insulator 254. Thus, oxygen can be supplied from the region to the metal oxide 230 through the insulator 224. Here, with the insulator 254 having a function of inhibiting upward oxygen diffusion, oxygen can be prevented from diffusing from the metal oxide 230 into the insulator 280. Moreover, with the insulator 222 having a function of inhibiting downward oxygen diffusion, oxygen can be prevented from diffusing from the metal oxide 230 to the substrate side. In the above manner, oxygen is supplied to the channel formation region of the metal oxide 230. Accordingly, oxygen vacancies in the metal oxide 230 can be reduced, so that the transistor can be prevented from having normally-on characteristics.

As the insulator 254, an insulator containing an oxide of one or both of aluminum and hafnium is formed, for example. As the insulator containing an oxide of one or both of aluminum and hafnium, aluminum oxide, hafnium oxide, an oxide containing aluminum and hafnium (hafnium aluminate), or the like is preferably used.

The insulator 224, the insulator 250, and the metal oxide 230 are covered with the insulator 254 having a barrier property against hydrogen, whereby the insulator 280 is isolated from the insulator 224, the metal oxide 230, and the insulator 250 by the insulator 254. This can inhibit the entry of impurities such as hydrogen from the outside of the transistor 750, resulting in favorable electrical characteristics and high reliability of the transistor 750.

The insulator 280 is provided over the insulator 224, the metal oxide 230, and the conductor 242 with the insulator 254 therebetween. The insulator 280 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. Silicon oxide and silicon oxynitride are particularly preferable because of their thermal stability. In particular, materials such as silicon oxide, silicon oxynitride, and porous silicon oxide are preferably used, in which case a region containing oxygen released by heating can be easily formed.

The concentration of impurities such as water and hydrogen in the insulator 280 is preferably reduced. In addition, the top surface of the insulator 280 may be planarized.

Like the insulator 214 or the like, the insulator 274 preferably functions as a barrier insulating film that inhibits entry of impurities such as water and hydrogen into the insulator 280 from the above. As the insulator 274, for example, the insulator that can be used as the insulator 214, the insulator 254, and the like can be used.

The insulator 281 functioning as an interlayer film is preferably provided over the insulator 274. As in the insulator 224 or the like, the concentration of impurities such as water and hydrogen in the insulator 281 is preferably reduced.

The conductor 240a and the conductor 240b are placed in openings formed in the insulators 281, 274, 280, and 254. The conductors 240a and 240b are provided to face each other with the conductor 260 therebetween. Note that the top surfaces of the conductors 240a and 240b may be level with the top surface of the insulator 281.

The insulator 241a is provided in contact with the inner walls of the openings in the insulators 281, 274, 280, and 254, and a first conductor of the conductor 240a is formed in contact with the side surface of the insulator 241a. The conductor 242a is positioned on at least part of the bottom portion of the opening, and the conductor 240a is in contact with the conductor 242a. Similarly, the insulator 241b is provided in contact with the inner walls of the openings in the insulators 281, 274, 280, and 254, and a first conductor of the conductor 240b is formed in contact with the side surface of the insulator 241b. The conductor 242b is positioned on at least part of the bottom portion of the opening, and the conductor 240b is in contact with the conductor 242b.

The conductors 240a and 240b are preferably formed using a conductive material containing tungsten, copper, or aluminum as its main component. The conductors 240a and 240b may each have a stacked-layer structure.

In the case where the conductor 240 has a stacked-layer structure, the aforementioned conductor having a function of inhibiting diffusion of impurities such as water and hydrogen is preferably used as the conductor in contact with the metal oxide 230a, the metal oxide 230b, the conductor 242, the insulator 254, the insulator 280, the insulator 274, and the insulator 281. For example, tantalum, tantalum nitride, titanium, titanium nitride, ruthenium, ruthenium oxide, or the like is preferably used. The conductive material having a function of inhibiting diffusion of impurities such as water and hydrogen can be used as a single layer or stacked layers. The use of the conductive material can inhibit oxygen added to the insulator 280 from being absorbed by the conductor 240a and the conductor 240b. Moreover, impurities such as water and hydrogen can be inhibited from entering the metal oxide 230 through the conductor 240a and the conductor 240b from a layer above the insulator 281.

As the insulator 241a and the insulator 241b, the insulator that can be used as the insulator 254 or the like can be used, for example. Since the insulator 241a and the insulator 241b are provided in contact with the insulator 254, impurities such as water and hydrogen in the insulator 280 or the like can be inhibited from entering the metal oxide 230 through the conductor 240a and the conductor 240b. Furthermore, oxygen contained in the insulator 280 can be inhibited from being absorbed by the conductor 240a and the conductor 240b.

Although not illustrated, a conductor functioning as a wiring may be provided in contact with the top surfaces of the conductors 240a and 240b. For the conductor functioning as a wiring, a conductive material containing tungsten, copper, or aluminum as its main component is preferably used. Furthermore, the conductor may have a stacked-layer structure and may be a stack of any of the above conductive materials and titanium or titanium nitride. Note that the conductor may be formed to be embedded in an opening provided in an insulator.

<Materials for Transistor>

Materials that can be used for the transistor will be described.

[Substrate]

As a substrate over which the transistor is formed, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate of silicon carbide, silicon germanium, gallium arsenide, indium phosphide, zinc oxide, or gallium oxide. Other examples include any of the above semiconductor substrates including an insulator region, e.g., a silicon on insulator (SOI) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the elements provided over the substrates include a capacitor, a resistor, a switching element, a light-emitting element, and a memory element.

[Insulator]

Examples of an insulator include an oxide, a nitride, an oxynitride, a nitride oxide, a metal oxide, a metal oxynitride, and a metal nitride oxide, each of which has an insulating property. With miniaturization and high integration of a transistor, for example, a problem such as generation of a leakage current may arise because of a thinner gate insulator. When a high-k material is used for the insulator functioning as a gate insulator, the voltage at the time of operation of the transistor can be reduced while the physical thickness is maintained. By contrast, when a material with a low dielectric constant is used for the insulator functioning as an interlayer film, parasitic capacitance generated between wirings can be reduced. Thus, a material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor including an oxide semiconductor is surrounded by insulators having a function of inhibiting the passage of oxygen and impurities such as hydrogen (e.g., the insulator 214, the insulator 222, the insulator 254, and the insulator 274), the electrical characteristics of the transistor can be stable. An insulator having a function of inhibiting the passage of oxygen and impurities such as hydrogen can be formed to have a single layer or a stacked layer including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

An insulator functioning as a gate insulator preferably includes a region containing oxygen released by heating. For example, a structure where silicon oxide or silicon oxynitride that includes a region containing oxygen released by heating is provided in contact with the metal oxide 230 can compensate for oxygen vacancies in the metal oxide 230.

[Conductor]

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even when absorbing oxygen. A semiconductor having high electrical conductivity, typified by polycrystalline silicon containing an impurity element such as phosphorus, or silicide such as nickel silicide may be used.

A plurality of conductors formed using any of the above materials may be stacked. For example, a stacked-layer structure combining a material containing the above metal element and a conductive material containing oxygen may be employed. Alternatively, a stacked-layer structure combining a material containing the above metal element and a conductive material containing nitrogen may be employed. Alternatively, a stacked-layer structure combining a material containing the above metal element, a conductive material containing oxygen, and a conductive material containing nitrogen may be employed.

In the case where a metal oxide is used for the channel formation region of the transistor, the conductor functioning as the gate electrode preferably employs a stacked-layer structure combining a material containing the above metal element and a conductive material containing oxygen. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. A conductive material containing any of the above metal elements and nitrogen may also be used. For example, a conductive material containing nitrogen such as titanium nitride or tantalum nitride may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

<Classification of Crystal Structure of Oxide Semiconductor>

The classification of crystal structures of an oxide semiconductor will be described with reference to FIG. 13A. FIG. 13A shows the classification of crystal structures of an oxide semiconductor, typically IGZO (a metal oxide containing In, Ga, and Zn).

As shown in FIG. 13A, oxide semiconductors are roughly classified into "Amorphous", "Crystalline", and "Crystal". The term "Amorphous" includes a completely amorphous structure. The term "Crystalline" includes c-axis-aligned crystalline (CAAC), nanocrystalline (nc), and cloud-aligned composite (CAC) structures. Note that the term "Crystalline" excludes single crystal, poly crystal, and completely amorphous structures. The term "Crystal" includes single crystal and poly crystal structures.

Note that the structures in the thick frame in FIG. 13A are in an intermediate state between "Amorphous" and "Crystal", and belong to a new crystalline phase. That is, these structures are completely different from "Amorphous", which is energetically unstable, or "Crystal".

Note that a crystal structure of a film or a substrate can be evaluated with an X-ray diffraction (XRD) spectrum. FIG. 13B shows an XRD spectrum, which is obtained by grazing-incidence XRD (GIXD) measurement, of a CAAC-IGZO film classified into "Crystalline". Note that a GIXD method is also referred to as a thin film method or a Seemann-Bohlin method. The XRD spectrum that is shown in FIG. 13B and obtained by GIXD measurement is hereinafter simply referred to as an XRD spectrum. The CAAC-IGZO film in FIG. 13B has an atomic ratio of In:Ga:Zn=4:2:3 or a neighborhood thereof. The CAAC-IGZO film in FIG. 13B has a thickness of 500 nm.

In FIG. 13B, the horizontal axis represents 2θ [deg.], and the vertical axis represents intensity [a.u.]. As shown in FIG. 13B, a clear peak indicating crystallinity is observed in the XRD spectrum of the CAAC-IGZO film. Specifically, a peak indicating c-axis alignment is observed at 2θ of around 31° in the XRD spectrum of the CAAC-IGZO film. As shown in FIG. 13B, the peak at 2θ of around 31° is asymmetric with the angle at which the peak intensity is observed as the axis.

A crystal structure of a film or a substrate can also be evaluated with a diffraction pattern obtained by a nanobeam electron diffraction (NBED) method (such a pattern is also referred to as a nanobeam electron diffraction pattern). FIG. 13C shows a diffraction pattern of the CAAC-IGZO film. FIG. 13C shows a diffraction pattern obtained by the NBED method in which an electron beam is incident in the direction parallel to the substrate. The CAAC-IGZO film in FIG. 13C has an atomic ratio of In:Ga:Zn=4:2:3 or a neighborhood thereof. In the nanobeam electron diffraction method, electron diffraction is performed with a probe diameter of 1 nm.

As shown in FIG. 13C, a plurality of spots indicating c-axis alignment are observed in the diffraction pattern of the CAAC-IGZO film.

[Structure of Oxide Semiconductor]

Oxide semiconductors might be classified in a manner different from the one in FIG. 13A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more of aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M, Zn) layer) are stacked. Indium and the element M can be replaced with each other. Therefore, indium may be contained in the (M, Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low arrangement density of oxygen atoms in the a-b plane direction, an interatomic bond distance changed by substitution of a metal atom, or the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor; thus, the CAAC-OS can be referred to as an oxide semiconductor having a small amount of impurities or defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. There is no regularity of crystal orientation between different nanocrystals in the nc-OS. Hence, the orientation in the whole film is not observed. Accordingly, the nc-OS cannot be distinguished from an a-like OS or an amorphous oxide semiconductor depending on the analysis method. For example, when an nc-OS film is subjected to structural analysis by out-of-plane XRD measurement with an XRD apparatus using $\theta/2\theta$ scanning, a peak indicating crystallinity is not observed. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., larger than or equal to 1 nm and smaller than or equal to 30 nm).

[a-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has higher hydrogen concentration than the nc-OS and the CAAC-OS.

[Composition of Oxide Semiconductor]

Next, the CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film. This composition is hereinafter also referred to as a cloud-like composition. That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region of the CAC-OS in the In—Ga—Zn oxide has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current (I on), high field-effect mobility (1.1), and favorable switching operation can be achieved.

An oxide semiconductor can have any of various structures that show various different properties. Two or more of an amorphous oxide semiconductor, a polycrystalline oxide semiconductor, an a-like OS, the CAC-OS, an nc-OS, and the CAAC-OS may be included in an oxide semiconductor of one embodiment of the present invention.

<Transistor Including Oxide Semiconductor>

Next, a transistor including the above oxide semiconductor is described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in a film that is adjacent to the oxide semiconductor is preferably reduced. Examples of impurities include hydrogen, nitrogen, alkali metal, alkaline earth metal, iron, nickel, and silicon.

<Impurity>

The influence of impurities in the oxide semiconductor is described.

When silicon or carbon, which is one of Group 14 elements, is contained in the oxide semiconductor, defect states are formed in the oxide semiconductor. Thus, the concentration of each of silicon and carbon in the oxide semiconductor and in the vicinity of an interface with the oxide semiconductor (the concentration measured by SIMS) is set lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. A transistor including an oxide semiconductor that contains nitrogen tends to have normally-on characteristics. When nitrogen is contained in the oxide semiconductor, a trap state is sometimes formed. This might make the electrical characteristics of the transistor unstable. Thus, the concentration of nitrogen in the oxide semiconductor, which is measured by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, some hydrogen may be bonded to oxygen bonded to a metal atom and generate an electron serving as a carrier. Thus, a transistor including an oxide semiconductor that contains hydrogen tends to have normally-on characteristics. For this reason, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics.

Structure Example of Display Element 61

Figure 14A:
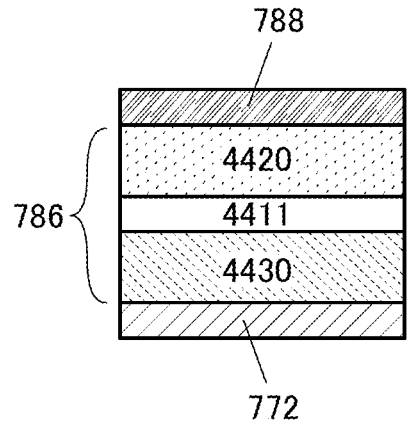
FIG. 14A to FIG. 14D are diagrams each illustrating a structure example of a display element.

An EL layer 786 included in the display element 61 can be formed of a plurality of layers such as a layer 4420, a light-emitting layer 4411, and a layer 4430, as illustrated in FIG. 14A. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which are provided between a pair of electrodes, can serve as a single light-emitting unit, and the structure in FIG. 14A is referred to as a single structure in this specification.

Figure 14B:
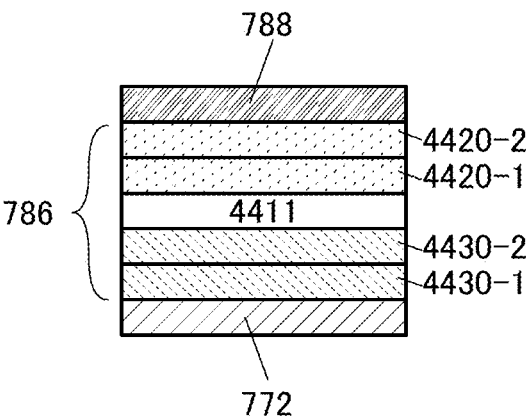

FIG. 14B shows a modification example of the EL layer 786 included in the display element 61 illustrated in FIG. 14A. Specifically, the display element 61 illustrated in FIG. 14B includes a layer 4430-1 over the conductor 772, a layer 4430-2 over the layer 4430-1, the light-emitting layer 4411 over the layer 4430-2, a layer 4420-1 over the light-emitting layer 4411, a layer 4420-2 over the layer 4420-1, and the conductor 788 over the layer 4420-2. For example, when the conductor 772 functions as an anode and the conductor 788 functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the conductor 772 functions as a cathode and the conductor 788 functions as an anode, the layer 4430-1 functions as an electron-injection layer, the layer 4430-2 functions as an electron-transport layer, the layer 4420-1 functions as a hole-transport layer, and the layer 4420-2 functions as the hole-injection layer. With such a layer structure, carriers can be efficiently injected to the light-emitting layer 4411, and the efficiency of the recombination of carriers in the light-emitting layer 4411 can be increased.

Figure 14C:
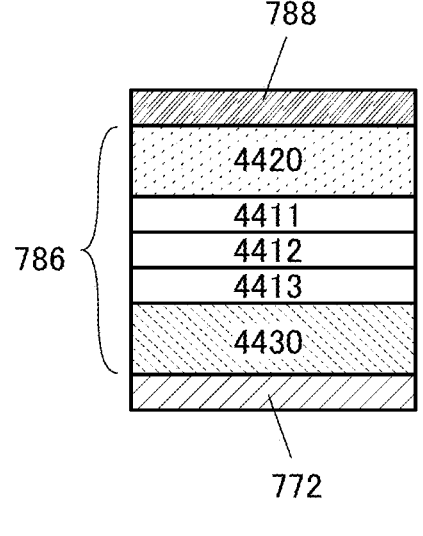

Note that the structure in which a plurality of light-emitting layers (light-emitting layers 4411, 4412, and 4413) are provided between the layer 4420 and the layer 4430 as illustrated in FIG. 14C is a variation of the single structure.

Figure 14D:
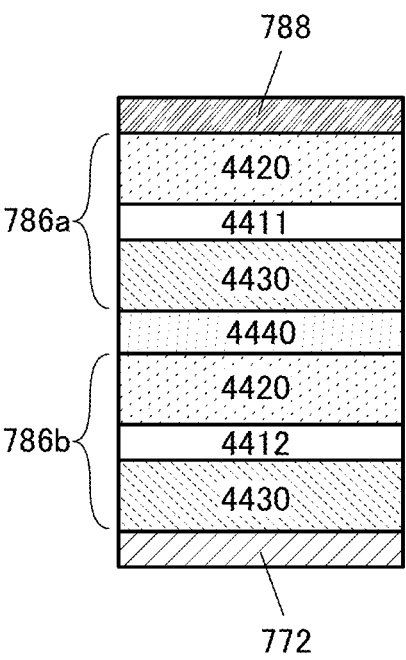

A structure in which a plurality of light-emitting units (EL layers 786a and 786b) are connected in series with an intermediate layer (a charge-generation layer) 4440 therebetween as illustrated in FIG. 14D is referred to as a tandem structure in this specification. Note that in this specification and the like, the structure illustrated in FIG. 14D is referred to as a tandem structure; however, without being limited to this, a tandem structure may be referred to as a stack structure, for example. The tandem structure enables a light-emitting element capable of high-luminance light emission.

Note that also in FIG. 14C and FIG. 14D, the layer 4420 and the layer 4430 may each have a stacked-layer structure of two or more layers as illustrated in FIG. 14B.

The emission color of the display element 61 can be red, green, blue, cyan, magenta, yellow, white, or the like depending on the material that constitutes the EL layer 786. Furthermore, the color purity can be further increased when the display element 61 has a microcavity structure.

The light-emitting element that emits white light preferably contains two or more kinds of light-emitting substances in the light-emitting layer. To obtain white light emission, two or more light-emitting substances may be selected so that their emission colors are complementary.

The light-emitting layer preferably contains two or more light-emitting substances that emit light of R (red), G (green), B (blue), Y (yellow), 0 (orange), and the like. Alternatively, the light-emitting layer preferably contains two or more light-emitting substances that each emit light containing two or more spectral components of R, G, and B.

<Formation Method of Display Element 61>

An example of a method for forming the display element 61 will be described below.

Figure 15A:
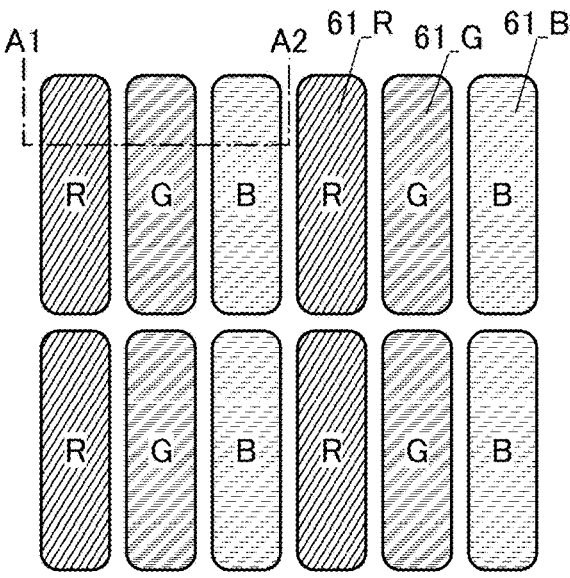
FIG. 15A to FIG. 15D are diagrams each illustrating a structure example of a display element.

FIG. 15A is a schematic top view of display elements 61_R, 61_G, and 61_B which can be used for the display element 61. The display element 61_R is a light-emitting element that exhibits red, the display element 61_G is a light-emitting element that exhibits green, and the display element 61_B is a light-emitting element that exhibits blue. In FIG. 15A, light-emitting regions of the light-emitting elements are denoted by R, G, and B to easily differentiate the light-emitting elements. Note that the structure illustrated in FIG. 15A may be referred to as an SBS (Side By Side) structure. Although the structure illustrated in FIG. 15A has three colors, red (R), green (G), and blue (B), one embodiment of the present invention is not limited thereto. For example, the structure may have four or more colors.

The display elements 61_R, 61_G, and 61_B are arranged in a matrix. FIG. 15A shows what is called a stripe arrangement, in which the light-emitting elements of the same color are arranged in one direction. Note that the arrangement method of the light-emitting elements is not limited thereto; another arrangement method such as a delta arrangement or a zigzag arrangement may be used, or a PenTile arrangement may also be used.

As the display elements 61_R, 61_G, and 61_B, an organic EL device such as an OLED (Organic Light Emitting Diode) or a QLED (Quantum-dot Light Emitting Diode) is preferably used. As a light-emitting substance contained in the EL element, a substance that emits fluorescence (a fluorescent material), a substance that emits phosphorescence (a phosphorescent material), an inorganic compound (e.g., a quantum dot material), and a substance that exhibits thermally activated delayed fluorescence (a thermally activated delayed fluorescent (TADF) material) can be given, for example.

Figure 15B:
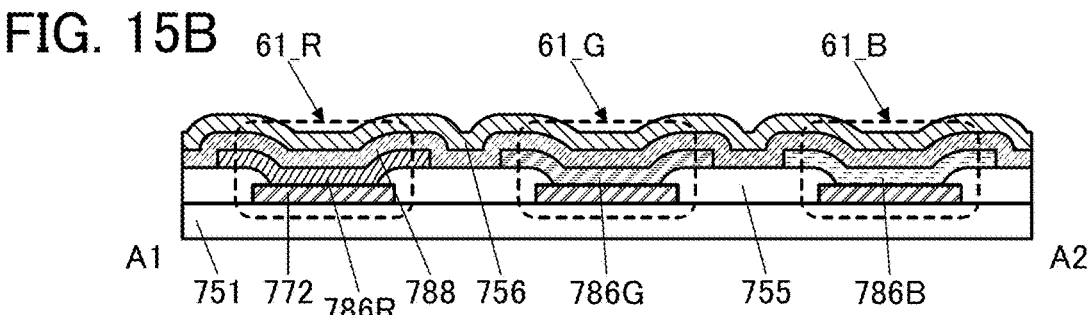

FIG. 15B is a cross-sectional schematic view taken along the dashed-dotted line A1-A2 in FIG. 15A.

FIG. 15B illustrates cross sections of the display elements 61_R, 61_G, and 61_B. Each of the display elements 61_R, 61_G, and 61_B is provided over a substrate 751 and includes a conductor 772 functioning as a pixel electrode and a conductor 788 functioning as a common electrode.

The display element 61_R includes an EL layer 786R between the conductor 772 and the conductor 788. The EL layer 786R contains at least a light-emitting organic compound that emits light with a peak in a red wavelength range. An EL layer 786G included in the display element 61_G contains at least a light-emitting organic compound that emits light with a peak in a green wavelength range. An EL layer 786B included in the display element 61_B contains at least a light-emitting organic compound that emits light with a peak in a blue wavelength range The EL layer 786R, the EL layer 786G, and the EL layer 786B may each include one or more of an electron-injection layer, an electron-transport layer, a hole-injection layer, and a hole-transport layer in addition to the layer containing a light-emitting organic compound (the light-emitting layer).

The conductor 772 is provided for each of the light-emitting elements. The conductor 788 is provided as a continuous layer shared by the light-emitting elements. A conductive film that transmits visible light is used for either the conductor 772 or the conductor 788 functioning as a common electrode, and a reflective conductive film is used for the other. The use of the light-transmitting conductor 772 and the reflective conductor 788 offers a bottom-emission display device, whereas the use of the reflective conductor 772 and the light-transmitting conductor 788 offers a top-emission display device. Note that when both the conductor 772 and the conductor 788 have a light-transmitting property, a dual-emission display device can be obtained.

An insulating layer 755 is provided to cover end portions of the conductor 772. End portions of the insulating layer 755 are preferably tapered.

The EL layer 786R, the EL layer 786G, and the EL layer 786B each include a region in contact with a top surface of the conductor 772 and a region in contact with a surface of the insulating layer 755. End portions of the EL layer 786R, the EL layer 786G, and the EL layer 786B are positioned over the insulating layer 755.

As illustrated in FIG. 15B, there is a gap between the EL layers of two light-emitting elements with different colors. In this manner, the EL layer 786R, the EL layer 786G, and the EL layer 786B are preferably provided so as not to be in contact with each other. This suitably prevents unintentional light emission (also referred to as crosstalk) from being caused by a current flowing through two adjacent EL layers. As a result, the contrast can be increased to achieve a display device with high display quality.

The EL layer 786R, the EL layer 786G, and the EL layer 786B can be formed separately by a vacuum evaporation method or the like using a shadow mask such as a metal mask. Alternatively, these layers may be formed separately by a photolithography method. The use of the photolithography method achieves a display device with high resolution, which is difficult to obtain in the case of using a metal mask.

Over the conductor 788, a protective layer 756 is provided to cover the display elements 61_R, 61_G, and 61_B. The protective layer 756 has a function of preventing diffusion of impurities such as water into the light-emitting elements from above.

The protective layer 756 can have, for example, a single-layer structure or a stacked-layer structure at least including an inorganic insulating film. As the inorganic insulating film, for example, an oxide film or a nitride film, such as a silicon oxide film, a silicon oxynitride film, a silicon nitride oxide film, a silicon nitride film, an aluminum oxide film, an aluminum oxynitride film, or a hafnium oxide film can be given. Alternatively, a semiconductor material such as indium gallium oxide or indium gallium zinc oxide may be used for the protective layer 756. The protective layer 756 may be formed by an ALD method, a CVD method, or a sputtering method. Although the protective layer 756 includes an inorganic insulating film in this example, one embodiment of the present invention is not limited thereto. For example, the protective layer 756 may have a stacked-layer structure of an inorganic insulating film and an organic insulating film.

Figure 15C:
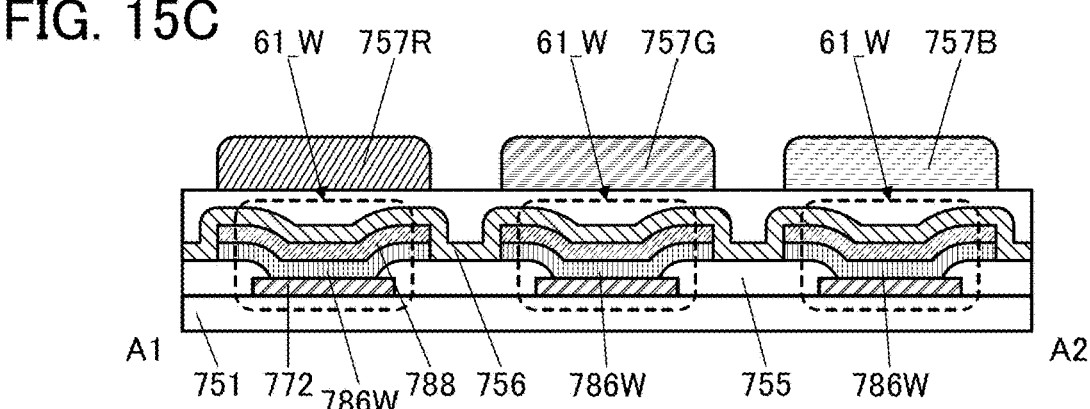

FIG. 15C illustrates an example different from the above example.

In FIG. 15C, a display element 61_W emitting white light is provided. The display element 61_W includes an EL layer 786W emitting white light between the conductor 772 and the conductor 788.

The EL layer 786W can have, for example, a structure in which two or more light-emitting layers that are selected so as to emit light of complementary colors are stacked. It is also possible to use a stacked EL layer, i.e., an EL layer having what is called a tandem structure, in which a charge-generation layer is provided between light-emitting layers. The tandem structure enables a light-emitting element capable of high-luminance light emission.

FIG. 15C illustrates three display elements 61_W side by side. A coloring layer 757R is provided above the left display element 61_W. The coloring layer 757R functions as a band path filter transmitting red light. Similarly, a coloring layer 757G transmitting green light is provided above the middle display element 61_W, and a coloring layer 757B transmitting blue light is provided above the right display element 61W. Thus, the display device can display color images.

Here, the EL layer 786W and the conductor 788 are each separated between two adjacent display elements 61W. This can suitably prevent unintentional light emission from being caused by current flowing through the EL layers 786W of the two adjacent display elements 61_W. In particular, when the EL layer 786W is a stacked EL element in which a charge-generation layer is provided between two light-emitting layers, the effect of crosstalk is more significant as the resolution increases, i.e., as the distance between adjacent pixels decreases, leading to lower contrast. Thus, the above structure can achieve a display device having both high resolution and high contrast.

A photolithography method is preferably used for the separation of the EL layer 786W and the separation of the conductor 788. This can reduce the distance between light-emitting elements, achieving a display device with a higher aperture ratio than that formed using, for example, a shadow mask such as a metal mask.

Note that in the case of a bottom-emission light-emitting element, a coloring layer is provided between the conductor 772 and the substrate 751.

Figure 15D:
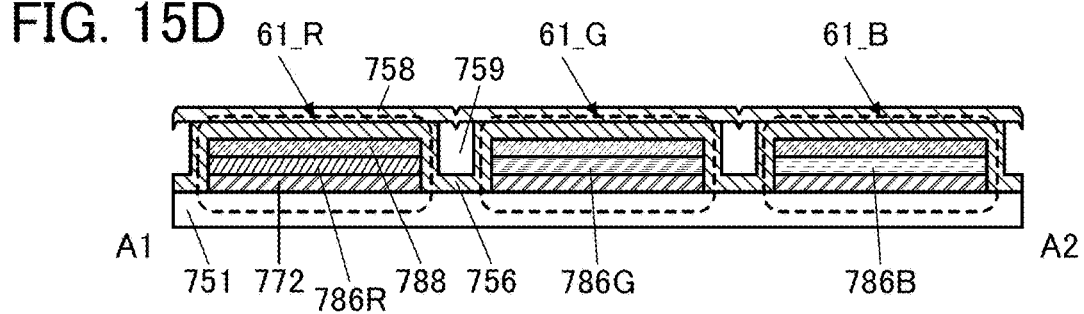

FIG. 15D illustrates an example different from the above. Specifically, the insulating layer 755 is not provided between the display element 61_R, the display element 61_G, and the display element 61_B in the structure in FIG. 15D. With this structure, the display device can have a high aperture ratio. In addition, the protective layer 756 covers side surfaces of the display element 61_R, the display element 61_G, and the display element 61_B. With this structure, impurities (typically, water) can be inhibited from entering the display element 61_R, the display element 61_G, and the display element 61_B through their side surfaces. In the structure illustrated in FIG. 15D, the top shapes of the conductor 772, the EL layer 786R, and the conductor 788 are substantially aligned with each other. This structure can be formed in such a manner that the conductor 772, the EL layer 786R, and the conductor 788 are formed and collectively processed using a resist mask or the like. In this process, the EL layer 786R and the conductor 753 are processed using the conductor 788 as a mask, and thus this process can be called selfalignment patterning. Note that although the display element 61_R is described here, the display element 61_G and the display element 61_B can have the same structure.

In FIG. 15D, a protective layer 758 is further provided over the protective layer 756. For example, the protective layer 756 can be formed with an apparatus that can deposit a film with excellent coverage (typically, an ALD apparatus), and the protective layer 758 can be formed with an apparatus that can deposit a film with coverage inferior to that of the protective layer 756 (typically, a sputtering apparatus), whereby a space 759 can be provided between the protective layer 756 and the protective layer 758. In other words, the space 759 is positioned between the display element 61_R and the display element 61_G and between the display element 61_G and the display element 61_B.

Note that the space 759 includes, for example, any one or more selected from air, nitrogen, oxygen, carbon dioxide, and Group 18 elements (typically, helium, neon, argon, xenon, and krypton). Furthermore, for example, a gas used during the deposition of the protective layer 758 is sometimes included in the space 759. For example, in the case where the protective layer 758 is deposited by a sputtering method, one or more of the above-described Group 18 elements may be included in the space 759. In the case where a gas is included in the space 759, a gas can be identified with a gas chromatography method or the like. Alternatively, in the case where the protective layer 758 is deposited by a sputtering method, a gas used in the sputtering is sometimes included in the protective layer 758. In this case, an element such as argon is sometimes detected when the protective layer 758 is analyzed by an energy dispersive X-ray analysis (EDX analysis) or the like.

In the case where the refractive index of the space 759 is lower than the refractive index of the protective layer 756, light emitted from the display element 61_R, the display element 61_G, or the display element 61_B is reflected in an interface between the protective layer 756 and the space 759. Thus, light emitted from the display element 61_R, the display element 61_G, or the display element 61_B can be inhibited from entering an adjacent pixel. With the structure, mixture of light of different colors can be inhibited, so that the image quality of the display device can be improved.

In the case of the structure illustrated in FIG. 15D, a region between the display element 61_R and the display element 61_G or a region between the display element 61_G and the display element 61_B (hereinafter simply referred to as a distance between the light-emitting elements) can be shortened. Specifically, the distance between the light-emitting elements can be less than or equal to 1 μm, preferably less than or equal to 500 nm, further preferably less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or 10 nm. In other words, the display device includes a region in which an interval between the side surface of the display element 61_R and the side surface of the display element 61_G or an interval between the side surface of the display element 61_G and the side surface of the display element 61_B is less than or equal to 1 μm, preferably less than or equal to 0.5 μm (500 nm), further preferably less than or equal to 100 nm.

In the case where the space 759 includes air, for example, the structure illustrated in FIG. 15D can be referred to as an air isolation structure. The air isolation structure allows the light-emitting elements to be isolated from each other and color mixing of light or crosstalk between the light-emitting elements can be inhibited.

Figure 16A:
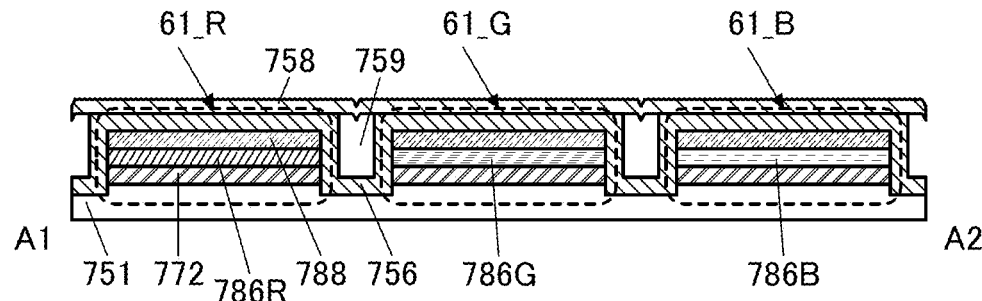
FIG. 16A and FIG. 16B are diagrams each illustrating a structure example of a display element.

FIG. 16A illustrates an example different from the above. Specifically, the structure illustrated in FIG. 16A is different from the structure illustrated in FIG. 15D in the structure of the substrate 751. A top surface of the substrate 751 is partly removed when the display element 61_R, the display element 61_G, and the display element 61_B are processed, and a depressed portion is formed. The protective layer 756 is formed in the depressed portion. In other words, in the cross-sectional view, a region is provided, in which the bottom surface of the protective layer 756 is positioned below the bottom surface of the conductor 772. With the region, impurities (typically, water or the like) can be suitably inhibited from entering the display element 61_R, the display element 61_G, and the display element 61_B from the bottom. It is likely that the depressed portion can be formed when impurities (also referred to as residue) that could be attached to the side surfaces of the display element 61_R, the display element 61_G, and the display element 61_B in processing of the display elements are removed by e.g., wet etching. After the residue is removed, the side surfaces of the light-emitting elements are covered with the protective layer 756, whereby a highly reliable display device can be provided.

Figure 16B:
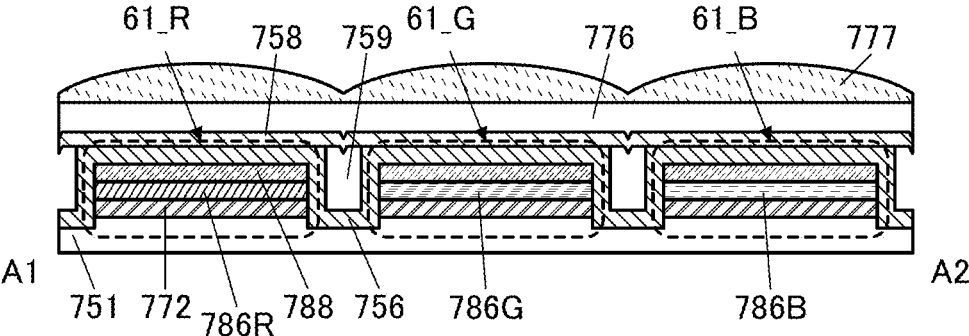

FIG. 16B illustrates an example different from the above. Specifically, the structure illustrated in FIG. 16B includes an insulating layer 776 and a microlens array 777 in addition to the structure illustrated in FIG. 16A. The insulating layer 776 has a function of an adhesive layer. Note that when the refractive index of the insulating layer 776 is lower than the refractive index of the microlens array 777, the microlens array 777 can condense light emitted from the display element 61_R, the display element 61_G, and the display element 61_B. This can increase the light extraction efficiency of the display device. In particular, this is suitable, because a user can see bright images when the user sees the display surface from the front of the display device. As the insulating layer 776, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component-mixture-type resin may be used. An adhesive sheet or the like may be used.

<Number of Display Devices 10>

The number of display devices manufactured from one substrate, when a 12-inch S1 wafer is used as the substrate 11, is estimated. Table 1 shows specifications used for the estimation. Note that the distance between regions (2.64× 7.92 μm), which is defined by the pixel size, is estimated to be 0.55 μm when the pixel arrangement is in RGB stripes.

TABLE 1

| Display region (diagonal) | 1.50 inch |
|---|---|
| Resolution | 3207 ppi |
| Aspect ratio | 4:3 |
| Pixel count | 3840 × 2880 |
| Screen size | 30.4 mm × 22.8 mm |
| Frame frequency | 90 Hz |

TABLE 1-continued

| Si technology node | 55 nm |
|---|---|
| Pixel size (1 dot) | 2.64 × 7.92 um |
| Driver | Incorporated |
| Duty driving | Available |
| Luminance | 5000 cd/m2 |
| Pin extraction | 2 FPCs |

Figures 17A, 17B:
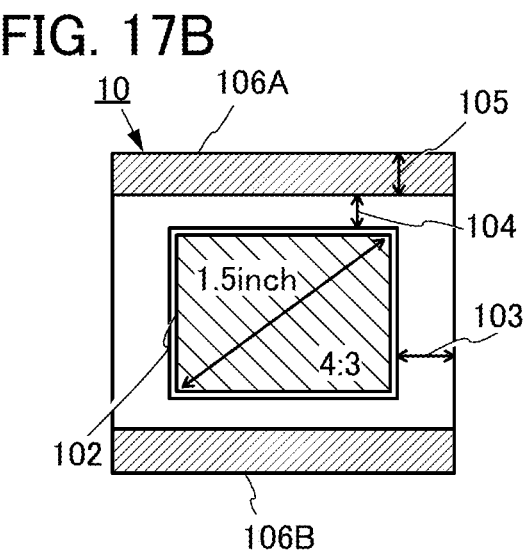
FIG. 17A and FIG. 17B are layout diagrams of display devices manufactured using a 12-inch wafer.

FIG. 17A illustrates a layout of a display device 10A that can be formed over a 12-inch S1 wafer serving as s substrate 100A. From one 12-inch S1 wafer, 72 display devices 10A can be manufactured.

FIG. 17A also shows a layout diagram of the display device 10 that can be fabricated over a substrate 100B, which is a 5-inch rectangular S1 wafer. Two display devices 10 can be fabricated over the substrate 100B, which is a 5-inch S1 wafer.

FIG. 17B is diagram illustrating a layout of the display device 10 fabricated over the substrate 100B, which is a 5-inch S1 wafer. As illustrated in FIG. 17B, a region 102 corresponding to the screen size has an aspect ratio of 4:3 and is 1.5 inches. Terminal portions 106A and 106B to be connected to an FPC are provided above and below the region 102. Note that in FIG. 17B, an arrow 103 and an arrow 104 each indicating the width (margin) for sealing the elements of the display device 10 are 7 mm and 6 mm, respectively, and an arrow 105 indicating the width of terminal portion 106A or 106B is 6.6 mm.

The structures described in this embodiment can be used in an appropriate combination with the structures described in the other embodiments and the like.

Embodiment 3

In this embodiment, examples of an electronic device in which a display device of one embodiment of the present invention can be used will be described.

The display device of one embodiment of the present invention can be suitably used for a portable electronic device, a wearable electronic device (wearable device), an e-book reader, and the like. In addition, the display device can be suitably used for a VR (Virtual Reality) device, an AR (Augmented Reality) device, and the like.

FIG. 18A is a diagram illustrating an external view of a head-mounted display 8200.

The head-mounted display 8200 includes a wearing portion 8201, a lens 8202, a main body 8203, a display portion 8204, a cable 8205, and the like. A battery 8206 is incorporated in the wearing portion 8201.

The cable 8205 supplies electric power from the battery 8206 to the main body 8203. The main body 8203 includes a wireless receiver or the like and can display an image corresponding to the received image data or the like on the display portion 8204. The movement of the eyeball or the eyelid of the user can be captured by a camera provided in the main body 8203 and then coordinates of the sight line of the user can be calculated using the information to utilize the sight line of the user as an input means.

A plurality of electrodes may be provided in the wearing portion 8201 at a position in contact with the user. The main body 8203 may have a function of sensing current flowing through the electrodes along with the movement of the user's eyeball to recognize the user's sight line. The main body 8203 may have a function of sensing current flowing through the electrodes to monitor the user's pulse. The wearing portion 8201 may include various sensors such as a temperature sensor, a pressure sensor, and an acceleration sensor to have a function of displaying the user's biological information on the display portion 8204. The main body 8203 may sense the movement of the user's head or the like to change an image displayed on the display portion 8204 in synchronization with the movement.

The display device of one embodiment of the present invention can be used in the display portion 8204. Thus, the power consumption of the head-mounted display 8200 can be reduced, so that the head-mounted display 8200 can be used continuously for a long time. The power consumption of the head-mounted display 8200 can be reduced, which allows the battery 8206 to be downsized and lighter and accordingly allows the head-mounted display 8200 to be downsized and lighter. Thus, a burden of the user of the head-mounted display 8200 can be reduced, and the user is less likely to feel fatigue.

FIG. 18B, FIG. 18C, and FIG. 18D are external views of a head-mounted display 8300. The head-mounted display 8300 includes a housing 8301, a display portion 8302, a fixing band 8304, and a pair of lenses 8305. A battery 8306 is incorporated in the housing 8301, and electric power can be supplied from the battery 8306 to the display portion 8302 and the like.

A user can see display on the display portion 8302 through the lenses 8305. It is suitable that the display portion 8302 be curved and placed. When the display portion 8302 is curved and placed, a user can feel a high realistic sensation. Note that although the structure in which one display portion 8302 is provided is described in this embodiment as an example, the structure is not limited thereto, and a structure in which two display portions 8302 are provided may also be employed. In that case, one display portion is placed for one eye of the user, so that three-dimensional display using parallax or the like is possible.

The above-described display device can be used in the display portion 8302. Thus, the power consumption of the head-mounted display 8300 can be reduced, so that the head-mounted display 8300 can be used continuously for a long time. The power consumption of the head-mounted display 8300 can be reduced, which allows the battery 8306 to be downsized and lighter and accordingly allows the head-mounted display 8300 to be downsized and lighter. Thus, a burden of the user of the head-mounted display 8300 can be reduced, and the user is less likely to feel fatigue.

Figure 19A:
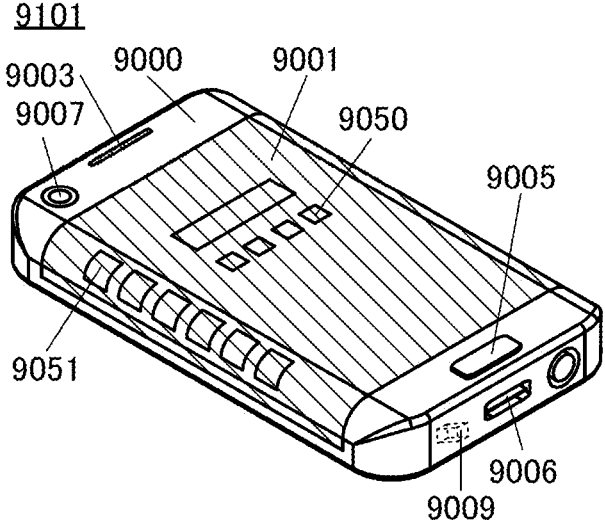
FIG. 19A and FIG. 19B are diagrams each illustrating a structure example of an electronic device.
Figure 19B:
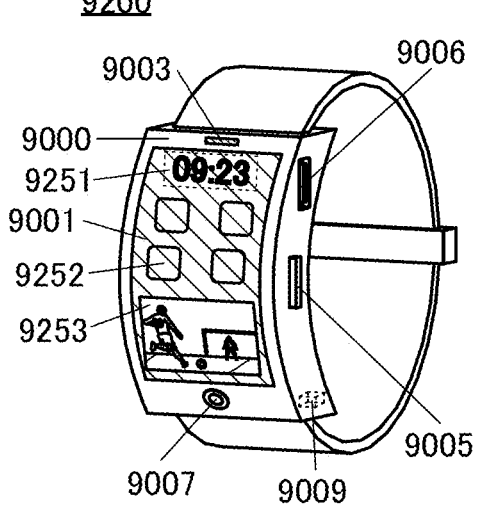

Next, FIG. 19A and FIG. 19B illustrate examples of electronic devices that are different from the electronic devices illustrated in FIG. 18A to FIG. 18D.

Electronic devices illustrated in FIG. 19A and FIG. 19B include a housing 9000, a display portion 9001, a speaker 9003, an operation key 9005 (including a power switch or an operation switch), a connection terminal 9006, a sensor 9007 (having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a battery 9009, and the like.

The electronic devices illustrated in FIG. 19A and FIG. 19B have a variety of functions. Examples of the functions include a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a memory medium and displaying it on the display portion. Note that functions of the electronic devices illustrated in FIG. 19A and FIG. 19B are not limited thereto, and the electronic devices can have a variety of functions. Although not illustrated in FIG. 19A and FIG. 19B, the electronic devices may each include a plurality of display portions. The electronic devices may each include a camera and the like and have a function of taking a still image, a function of taking a moving image, a function of storing the taken image in a memory medium (externally attached or incorporated in the camera), a function of displaying the taken image on the display portion, and the like.

The details of the electronic devices illustrated in FIG. 19A and FIG. 19B will be described below.

FIG. 19A is a perspective view illustrating a portable information terminal 9101. The portable information terminal 9101 has a function of, for example, one or more selected from a telephone set, a notebook, an information browsing system, and the like. Specifically, the portable information terminal can be used as a smartphone. The portable information terminal 9101 can display text, an image, or the like on its plurality of surfaces. For example, three operation buttons 9050 (also referred to as operation icons, or simply, icons) can be displayed on one surface of the display portion 9001. Information 9051 indicated by a dashed rectangular can be displayed on another surface of the display portion 9001. Examples of the information 9051 include display indicating reception of an e-mail, an SNS (social networking service), a telephone call, or the like; the title of an e-mail, an SNS, or the like; the sender of an e-mail, an SNS, or the like; the date; the time; remaining battery; or the reception strength of an antenna. Alternatively, the operation buttons 9050 or the like may be displayed on the position where the information 9051 is displayed, in place of the information 9051.

The above-described display device can be used for the portable information terminal 9101. Thus, the power consumption of the portable information terminal 9101 can be reduced, so that the portable information terminal 9101 can be used continuously for a long time. The power consumption of the portable information terminal 9101 can be reduced, which allows the battery 9009 to be downsized and lighter and accordingly allows the portable information terminal 9101 to be downsized and lighter. Thus, the portability of the portable information terminal 9101 can be increased.

FIG. 19B is a perspective view of a watch-type portable information terminal 9200. The portable information terminal 9200 can execute a variety of applications such as mobile phone calls, e-mailing, viewing and editing texts, music reproduction, Internet communication, and computer games. The display surface of the display portion 9001 is curved, and display can be performed on the curved display surface. FIG. 19B illustrates an example in which time 9251, operation buttons 9252 (also referred to as operation icons, or simply, icons), and a content 9253 are displayed on the display portion 9001. The content 9253 can be a moving image, for example.

The portable information terminal 9200 is capable of executing near field communication conformable to a communication standard. For example, mutual communication with a headset capable of wireless communication enables hands-free calling. The portable information terminal 9200 includes the connection terminal 9006, and data can be directly transmitted to and received from another information terminal via a connector. Power charging through the connection terminal 9006 is also possible. Note that the charging operation may be performed by wireless power feeding without through the connection terminal 9006.

The above-described display device can be used for the portable information terminal 9200. Thus, the power consumption of the portable information terminal 9200 can be reduced, so that the portable information terminal 9200 can be continuously used for a long time. The power consumption of the portable information terminal 9200 can be reduced, which allows the battery 9009 to be downsized and lighter and accordingly allows the portable information terminal 9200 to be downsized and lighter. Thus, the portability of the portable information terminal 9200 can be increased.

At least part of this embodiment can be implemented in combination with the other embodiments described in this specification as appropriate.

<Supplementary Notes on Description in this Specification and the Like>

The following are notes on the description of the foregoing embodiments and the structures in the embodiments.

One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that a content (or part thereof) described in one embodiment can be applied to, combined with, or replaced with another content (or part thereof) in the same embodiment and/or a content (or part thereof) described in another embodiment or other embodiments, for example.

Note that in each embodiment, a content described in the embodiment is a content described with reference to a variety of diagrams or a content described with text disclosed in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In this specification and the like, components are classified on the basis of the functions, and shown as blocks independent of one another in block diagrams. However, in an actual circuit and the like, such components are sometimes hard to classify functionally, and there is a case where one circuit is associated with a plurality of functions and a case where a plurality of circuits are associated with one function. Therefore, the blocks in the block diagrams are not limited by the components described in the specification, and the description can be changed appropriately depending on the situation.

In drawings, the size, the layer thickness, or the region is shown arbitrarily for description convenience. Therefore, the size, the layer thickness, or the region is not limited to the illustrated scale. Note that the drawings are schematically shown for clarity, and embodiments of the present invention are not limited to shapes, values, or the like shown in the drawings. For example, variation in signal, voltage, or current due to noise or variation in signal, voltage, or current due to difference in timing can be included.

In this specification and the like, the terms "one of a source and a drain" (or a first electrode or a first terminal)

and "the other of the source and the drain" (or a second electrode or a second terminal) are used to describe the connection relationship of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the terms such as "electrode" or "wiring" do not limit the functions of the components. For example, an "electrode" is used as part of a "wiring" in some cases, and vice versa. Furthermore, the term such as "electrode" or "wiring" also includes the case where a plurality of "electrodes" and "wirings" are formed in an integrated manner, for example.

In this specification and the like, voltage and potential can be replaced with each other as appropriate. The term voltage refers to a potential difference from a reference potential, and when the reference potential is a ground potential, for example, voltage can be replaced with potential. The ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, the term "conductive layer" can be changed into the term "conductive film" in some cases. Also, for example, the term "insulating film" can be changed into the term "insulating layer" in some cases.

In this specification and the like, a switch is in a conduction state (on state) or in a non-conduction state (off state) to determine whether current flows therethrough or not. Alternatively, a switch has a function of selecting and changing a current path.

In this specification and the like, the channel length refers to, for example, the distance between a source and a drain in a region where a semiconductor (or a portion where current flows in a semiconductor when a transistor is on) and a gate overlap with each other or a region where a channel is formed in a top view of the transistor.

In this specification and the like, the channel width refers to, for example, the length of a portion where a source and a drain face each other in a region where a semiconductor (or a portion where current flows in a semiconductor when a transistor is on) and a gate electrode overlap with each other or a region where a channel is formed.

In this specification and the like, the expression "A and B are connected" means the case where A and B are electrically connected to each other as well as the case where A and B are directly connected to each other. Here, the expression "A and B are electrically connected" means the case where electric signals can be transmitted and received between A and B when an object having any electric action exists between A and B.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a white-light-emitting device that is combined with coloring layers (e.g., color filters) can be a light-emitting device for full-color display.

Structures of light-emitting devices can be classified roughly into a single structure and a tandem structure. A device having a single structure includes one light-emitting unit between a pair of electrodes, and the light-emitting unit preferably includes one or more light-emitting layers. To obtain white light emission, two or more light-emitting layers are selected such that emission colors of the light-emitting layers are complementary colors. For example, when emission colors of a first light-emitting layer and a second light-emitting layer are complementary colors, the light-emitting device can be configured to emit white light as a whole. The same applies to a light-emitting device including three or more light-emitting layers.

A device having a tandem structure includes two or more light-emitting units between a pair of electrodes, and each light-emitting unit preferably includes one or more light-emitting layers. To obtain white light emission, the structure is made so that light from light-emitting layers of the light-emitting units can be combined to be white light. Note that a structure for obtaining white light emission is similar to a structure in the case of a single structure. In the device having a tandem structure, it is suitable that an intermediate layer such as a charge-generation layer is provided between a plurality of light-emitting units.

When the white-light-emitting device (having a single structure or a tandem structure) and a light-emitting device having an SBS structure are compared to each other, the light-emitting device having a SBS structure can have lower power consumption than the white-light-emitting device. To reduce power consumption, a light-emitting device having an SBS structure is preferably used. Meanwhile, the white-light-emitting device is preferable in terms of lower manufacturing cost or higher manufacturing yield because the manufacturing process of the white-light-emitting device is simpler than that of a light-emitting device having a SBS structure.

REFERENCE NUMERALS

10: display device, 11: substrate, 12: substrate, 13: display portion, 14: terminal portion, 20: layer, 21: transistor, 22: channel formation region, 30: driver circuit, 40: functional circuit, 50: layer, 51: pixel circuit, 52: transistor, 54: channel formation region, 60: layer, 61: display element

The invention claimed is:

1. A display device comprising:
a first layer including a first gate driver circuit, a second gate driver circuit, a first source driver circuit, a second source driver circuit, and a functional circuit;
a second layer including a first pixel circuit in a first region and a second pixel circuit in a second region; and
a third layer including a first display element and a second display element,
wherein the first pixel circuit is electrically connected to the first gate driver circuit, the first source driver circuit, and the first display element,
wherein the second pixel circuit is electrically connected to the second gate driver circuit, the second source driver circuit, and the second display element,
wherein the first region of the second layer has a region overlapping with the first gate driver circuit and the first source driver circuit,
wherein the second region of the second layer overlaps with the second gate driver circuit and the second source driver circuit, and
wherein the functional circuit is configured to control the first gate driver circuit, the second gate driver circuit, the first source driver circuit, and the second source driver circuit.

2. The display device according to claim 1,
wherein the first layer comprises a first transistor containing silicon in a channel formation region,
wherein the second layer comprises a second transistor containing a metal oxide in a channel formation region.

3. The display device according to claim 2,
wherein the metal oxide comprises In, an element M, and Zn, and,
wherein the element M is Al, Ga, Y, or Sn.

4. The display device according to claim 1,
wherein each of the first display element and the second display element comprises an organic EL element, and
wherein the organic EL element is a display element processed by a photolithography method.

5. The display device according to claim 1,
wherein the second layer is positioned over the first layer, and
wherein the third layer is positioned over the second layer.

* * * * *